(12) United States Patent
Hosotani

(10) Patent No.: US 7,239,545 B2
(45) Date of Patent: Jul. 3, 2007

(54) MAGNETIC RANDOM ACCESS MEMORY, MAGNETIC RANDOM ACCESS MEMORY MANUFACTURING METHOD, AND MAGNETIC RANDOM ACCESS MEMORY WRITE METHOD

(75) Inventor: Keiji Hosotani, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 115 days.

(21) Appl. No.: 11/200,105

(22) Filed: Aug. 10, 2005

(65) Prior Publication Data

US 2006/0221680 A1   Oct. 5, 2006

(30) Foreign Application Priority Data

Mar. 31, 2005   (JP)   ............................. 2005-100972

(51) Int. Cl.
  *G11C 11/14*   (2006.01)
(52) U.S. Cl. ........................ 365/171; 365/158; 365/173
(58) Field of Classification Search ................ 365/171, 365/158, 173
See application file for complete search history.

(56) References Cited

U.S. PATENT DOCUMENTS 6,829,162 B2   12/2004   Hosotani 7,068,531 B2 *   6/2006   Katti ........................... 365/158

OTHER PUBLICATIONS

Roy Scheuerlein et al., "A 10ns Read and Write Non-Volatile Memory Array Using a Magnetic Tunnel Junction and FET Switch in each Cell", 2000 Digest of Technical Papers, vol. Forty-Three ISSN 0193-6530, Feb. 8, 2000, pp. 128-129 and Cover page.
U.S. Appl. No. 11/133,383, filed May 20, 2005, Yoshihiro Ueda et al.

* cited by examiner

*Primary Examiner*—Van Thu Nguyen
*Assistant Examiner*—N Nguyen
(74) *Attorney, Agent, or Firm*—Oblon, Spivak, McClelland, Maier & Neustadt, P.C.

(57) ABSTRACT

A magnetic random access memory includes first and second write wirings, the second write wiring having first and second crossing angles formed by crossing the first write wiring, a first magnetoresistive element having a first axis of easy magnetization directed to a side of the first crossing angle and having a first recording layer including first and second ferromagnetic layers and a first nonmagnetic layer, and a second magnetoresistive element being electrically connected to the first magnetoresistive element, having a second axis of easy magnetization directed to a side of the second crossing angle, and having a second recording layer including third and fourth ferromagnetic layers and a second nonmagnetic layer, wherein in a write operation, magnetizations in the first and second recording layers execute a toggle operation by using the first and second write wirings.

15 Claims, 19 Drawing Sheets

| | First MTJ element <br> ⬭ 100 e1 | Second MTJ element <br> e2 ⬭ 200 |
|---|---|---|
| First state (sequence in FIG. 2) | Reverse "1" state | → "1" state |
| Second state (sequence in FIG. 3) | Reverse "1" state | ← "0" state |
| Third state (sequence in FIG. 8) | Unchanged "0" state | → "1" state |
| Fourth state (sequence in FIG. 9) | Unchanged "0" state | ← "0" state |

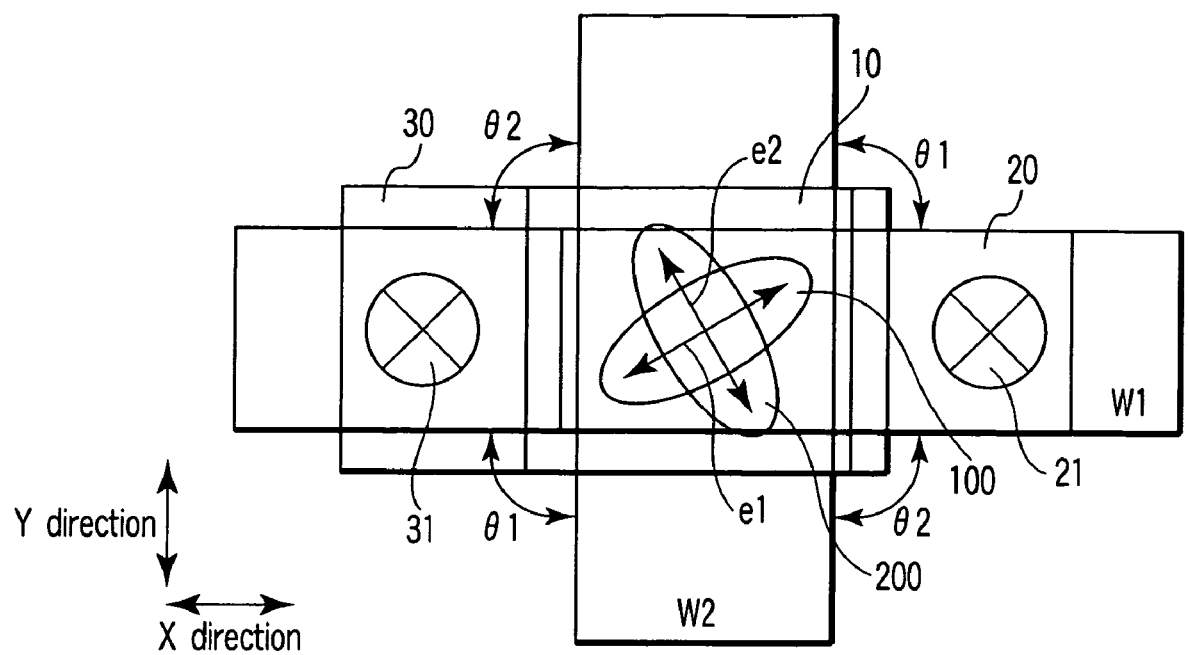
F I G. 21

MAGNETIC RANDOM ACCESS MEMORY, MAGNETIC RANDOM ACCESS MEMORY MANUFACTURING METHOD, AND MAGNETIC RANDOM ACCESS MEMORY WRITE METHOD

CROSS-REFERENCE TO RELATED APPLICATIONS

This application is based upon and claims the benefit of priority from prior Japanese Patent Application No. 2005-100972, filed Mar. 31, 2005, the entire contents of which are incorporated herein by reference.

BACKGROUND OF THE INVENTION

1. Field of the Invention

The present invention relates to a magnetic random access memory (MRAM) using a magnetoresistive effect, magnetic random access memory manufacturing method, and magnetic random access memory write method.

2. Description of the Related Art

Magnetic random access memories (MRAMs) using a tunneling magnetoresistive (TMR) effect have been proposed recently as information storage elements (e.g., Roy Scheuerlein et al., "A 10 ns Read and Write Non-Volatile Memory Array Using a Magnetic Tunnel Junction and FET Switch in each Cell", ISSCC 2000 Technical Digest, p. 128).

A memory cell of a magnetic random access memory comprises an upper write wiring, lower write wiring, and magnetic tunnel junction (MTJ) element provided between the upper and lower write wirings. The MTJ element has a fixed layer, recording layer, and tunnel barrier layer sandwiched between the fixed layer and the recording layer.

In a so-called toggle cell, the direction of axis of easy magnetization of the MTJ element tilts 45° with respect to the running direction of the upper or lower write wiring. The recording layer of the MTJ element has a three-layer structure of ferromagnetic layer/nonmagnetic layer/ferromagnetic layer. The two ferromagnetic layers are anti-ferromagnetically coupled through the nonmagnetic layer.

In a write operation of such a toggle cell, first, current is sequentially supplied to the upper and lower write wirings. Then, supply of the currents is stopped in the same order as that of its start. With this process, magnetization reversal occurs regardless of the initial magnetization state. Hence, before the write, data of the MTJ element is read out to determine the current cell state. After that, the write operation is started as needed.

The resistance state of the MTJ element changes between "1" and "0" depending on whether the magnetization direction of the fixed layer and that of the ferromagnetic layer of the recording layer located on the fixed layer side is parallel or anti-parallel. The read operation can be executed by extracting the resistance state.

The toggle cell is hardly affected by a variation in magnetization reversal threshold value of each MTJ element in principle and can advantageously be used for increasing the scale of magnetic random access memories. However, it is not yet the standard technique of magnetic random access memories because of problems such as the large write current and low write speed.

BRIEF SUMMARY OF THE INVENTION

According to a first aspect of the present invention, there is provided a magnetic random access memory comprising a first write wiring which runs in a first direction, a second write wiring which runs in a second direction different from the first direction and has a first crossing angle and second crossing angle formed by crossing the first write wiring, the first crossing angle and second crossing angle being located on both sides of the first write wiring serving as a boundary, a first magnetoresistive element which is arranged at an intersection of the first write wiring and the second write wiring between the first write wiring and the second write wiring, has a first axis of easy magnetization directed to a side of the first crossing angle, and has a first fixed layer, a first recording layer, and a first tunnel barrier layer sandwiched between the first fixed layer and the first recording layer, the first recording layer including a first ferromagnetic layer located on a side of the first fixed layer, a second ferromagnetic layer, and a first nonmagnetic layer sandwiched between the first ferromagnetic layer and the second ferromagnetic layer, and a second magnetoresistive element which is arranged at the intersection of the first write wiring and the second write wiring between the first write wiring and the second write wiring and electrically connected to the first magnetoresistive element, has a second axis of easy magnetization directed to a side of the second crossing angle, and has a second fixed layer, a second recording layer, and a second tunnel barrier layer sandwiched between the second fixed layer and the second recording layer, the second recording layer including a third ferromagnetic layer located on a side of the second fixed layer, a fourth ferromagnetic layer, and a second nonmagnetic layer sandwiched between the third ferromagnetic layer and the fourth ferromagnetic layer, wherein in a write operation, magnetizations in the first recording layer and second recording layer execute a toggle operation by using the first write wiring and second write wiring.

According to a second aspect of the present invention, there is provided a magnetic random access memory comprising a first write wiring which runs in a first direction, a second write wiring which runs in a second direction different from the first direction and has a first crossing angle and second crossing angle formed by crossing the first write wiring, the first crossing angle and second crossing angle being located on both sides of the first write wiring serving as a boundary, a first magnetoresistive element which is arranged at an intersection of the first write wiring and the second write wiring between the first write wiring and the second write wiring, has a first axis of easy magnetization directed to a side of the first crossing angle, and has a first fixed layer, a first recording layer, and a first tunnel barrier layer sandwiched between the first fixed layer and the first recording layer, the first recording layer including a first ferromagnetic layer located on a side of the first fixed layer, a second ferromagnetic layer, and a first nonmagnetic layer sandwiched between the first ferromagnetic layer and the second ferromagnetic layer, and a second magnetoresistive element which is arranged at the intersection of the first write wiring and the second write wiring between the first write wiring and the second write wiring and electrically connected to the first magnetoresistive element, has a second axis of easy magnetization directed to a side of the second crossing angle, and has a second fixed layer, a second recording layer, and a second tunnel barrier layer sandwiched between the second fixed layer and the second recording layer.

According to a third aspect of the present invention, there is provided a write method of a magnetic random access memory which includes a first write wiring which runs in a first direction, a second write wiring which runs in a second direction different from the first direction and has a first crossing angle and second crossing angle formed by crossing the first write wiring, the first crossing angle and second crossing angle being located on both sides of the first write wiring serving as a boundary, a first magnetoresistive element which is arranged at an intersection of the first write wiring and the second write wiring between the first write wiring and the second write wiring, has a first axis of easy magnetization directed to a side of the first crossing angle, and has a first fixed layer, a first recording layer, and a first tunnel barrier layer sandwiched between the first fixed layer and the first recording layer, the first recording layer including a first ferromagnetic layer located on a side of the first fixed layer, a second ferromagnetic layer, and a first nonmagnetic layer sandwiched between the first ferromagnetic layer and the second ferromagnetic layer, and a second magnetoresistive element which is arranged at the intersection of the first write wiring and the second write wiring between the first write wiring and the second write wiring and electrically connected to the first magnetoresistive element, has a second axis of easy magnetization directed to a side of the second crossing angle, and has a second fixed layer, a second recording layer, and a second tunnel barrier layer sandwiched between the second fixed layer and the second recording layer, the second recording layer including a third ferromagnetic layer located on a side of the second fixed layer, a fourth ferromagnetic layer, and a second nonmagnetic layer sandwiched between the third ferromagnetic layer and the fourth ferromagnetic layer, the write method writing binary information in the first magnetoresistive element and second magnetoresistive element by supplying a first write current to the first write wiring and a second write current to the second write wiring, comprising starting supplying one current of one of the first write current and second write current earlier than the other current of the other of the first write current and second write current, supplying the other current in addition to the one current, reducing a current value of the one current to not more than a write threshold value earlier than the other current, and reducing a current value of the other current to not more than the write threshold value, wherein an order of starting or ending supply of the first write current and second write current and directions in which the first write current and second write current are supplied are changed to selectively cause one of the first magnetoresistive element and second magnetoresistive element to execute a toggle operation.

According to a fourth aspect of the present invention, there is provided a write method of a magnetic random access memory which includes a first write wiring which runs in a first direction, a second write wiring which runs in a second direction different from the first direction and has a first crossing angle and second crossing angle formed by crossing the first write wiring, the first crossing angle and second crossing angle being located on both sides of the first write wiring serving as a boundary, a first magnetoresistive element which is arranged at an intersection of the first write wiring and the second write wiring between the first write wiring and the second write wiring, has a first axis of easy magnetization directed to a side of the first crossing angle, and has a first fixed layer, a first recording layer, and a first tunnel barrier layer sandwiched between the first fixed layer and the first recording layer, the first recording layer including a first ferromagnetic layer located on a side of the first fixed layer, a second ferromagnetic layer, and a first nonmagnetic layer sandwiched between the first ferromagnetic layer and the second ferromagnetic layer, and a second magnetoresistive element which is arranged at the intersection of the first write wiring and the second write wiring between the first write wiring and the second write wiring and electrically connected to the first magnetoresistive element, has a second axis of easy magnetization directed to a side of the second crossing angle, and has a second fixed layer, a second recording layer, and a second tunnel barrier layer sandwiched between the second fixed layer and the second recording layer, the write method writing binary information in the first magnetoresistive element and second magnetoresistive element by supplying a first write current to the first write wiring and a second write current to the second write wiring, comprising starting supplying one current of one of the first write current and second write current earlier than the other current of the other of the first write current and second write current, supplying the other current in addition to the one current, reducing a current value of the one current to not more than a write threshold value earlier than the other current, and reducing a current value of the other current to not more than the write threshold value, wherein an order of starting or ending supply of the first write current and second write current and directions in which the first write current and second write current are supplied are changed to selectively independently execute a first operation and second operation, the first operation is causing or not causing the first magnetoresistive element to execute a toggle operation, and the second operation is reversing magnetization in the second recording layer of the second magnetoresistive element.

According to a fifth aspect of the present invention, there is provided a magnetic random access memory manufacturing method comprising forming a first write wiring, forming a first electrode above the first write wiring, forming a first material layer on the first electrode, processing the first material layer to form a first magnetoresistive element having a first axis of easy magnetization directed in a first direction, forming a interlayer around the first magnetoresistive element, forming a second electrode on the first magnetoresistive element, forming a second material layer on the second electrode, processing the second material layer to form a second magnetoresistive element having a second axis of easy magnetization directed in a second direction different from the first direction, and forming a second write wiring above the second magnetoresistive element.

According to a sixth aspect of the present invention, there is provided a magnetic random access memory manufacturing method comprising forming a first write wiring, forming a first electrode above the first write wiring, forming a first material layer, a contact layer, and a second material layer sequentially on the first electrode, processing the first material layer, the contact layer, and the second material layer at once to form a first magnetoresistive element, a contact, and a second magnetoresistive element, and forming a second write wiring above the second magnetoresistive element.

According to a seventh aspect of the present invention, there is provided a magnetic random access memory manufacturing method comprising forming a first write wiring and a first magnetoresistive element above a first substrate, forming a contact connected to the first magnetoresistive element, forming a second write wiring and a second magnetoresistive element above a second substrate different from the first substrate, and bonding the first substrate and second substrate to electrically connect the first magnetoresistive element and second magnetoresistive element through the contact.

BRIEF DESCRIPTION OF THE SEVERAL VIEWS OF THE DRAWING

FIG. 21 is a plan view showing a magnetic random access memory according to the other embodiment of the present invention.

DETAILED DESCRIPTION OF THE INVENTION

Figure 1A:
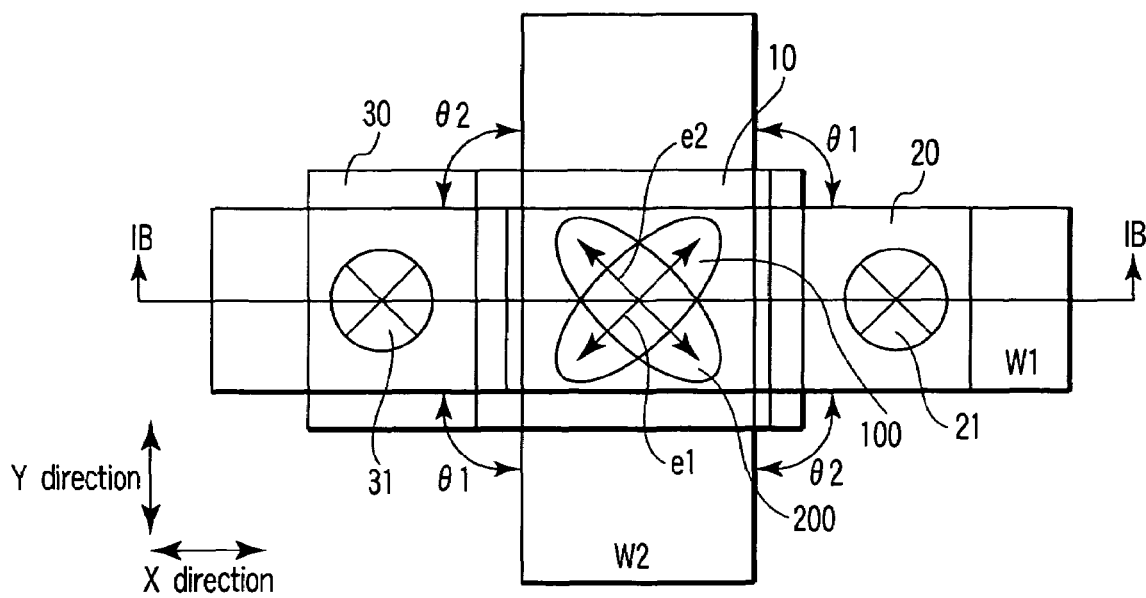
FIG. 1A is a plan view showing a magnetic random access memory according to the first embodiment of the present invention.

The embodiments of the present invention will be described below with reference to the accompanying drawing. The same reference numerals denote the same parts throughout the drawing.

[1] FIRST EMBODIMENT

[1-1] Structure

Figure 1B:
FIG. 1B is a sectional view of the magnetic random access memory taken along a line IB-IB in FIG. 1A.

FIG. 1A is a plan view of a magnetic random access memory according to the first embodiment of the present invention. FIG. 1B is a sectional view of the magnetic random access memory taken along a line IB-IB in FIG. 1A. The structure of the magnetic random access memory according to the first embodiment of the present invention will be described below.

As shown in FIGS. 1A and 1B, a first write wiring W1 runs in the X direction, and a second write wiring W2 runs in the Y direction (e.g., the direction almost perpendicular to the X direction). Series-connected first and second magnetic tunnel junction (MTJ) elements 100 and 200 are arranged at the intersection of the first and second write wirings W1 and W2 between them. An upper electrode 20 is arranged between the first MTJ element 100 and the first write wiring W1. One terminal of the upper electrode 20 is electrically connected to one terminal of the first MTJ element 100. The other terminal of the upper electrode 20 is electrically connected to one input of a sense amplifier 41 through a contact 21. A reference cell 42 is connected to the other input of the sense amplifier 41. A lower electrode 30 is arranged between the second MTJ element 200 and the second write wiring W2. One terminal of the lower electrode 30 is electrically connected to one terminal of the second MTJ element 200. The other terminal of the lower electrode 30 is connected to a read switching element (e.g., a transistor) 43 through a contact 31. An intermediate electrode (metal layer) 10 is arranged between the first and second MTJ elements 100 and 200. The intermediate electrode 10 is connected to the first and second MTJ elements 100 and 200. The first and second MTJ elements 100 and 200 are electrically isolated from the first and second write wirings W1 and W2.

When the first and second write wirings W1 and W2 cross, first and second crossing angles θ1 and θ2 (e.g., θ1, θ2=900°) are formed. The first and second crossing angles θ1 and θ2 are located on both sides of the first write wiring W1 or second write wiring W2 serving as a boundary. An axis e1 of easy magnetization of the first MTJ element 100 is directed to the side of the first crossing angle θ1 (e.g., the direction in which the first crossing angle θ1 is equally divided into two parts). An axis e2 of easy magnetization of the second MTJ element 200 is directed to the side of the second crossing angle θ2 (e.g., the direction in which the second crossing angle θ2 is equally divided into two parts).

Hence, the direction of the axis e1 of easy magnetization of the first MTJ element 100 tilts almost 45° with respect to the X or Y direction. The direction of the axis e2 of easy magnetization of the second MTJ element 200 tilts almost 45° with respect to the X or Y direction. The directions of the axes e1 and e2 of easy magnetization of the first and second MTJ elements 100 and 200 are different by almost 90°.

The tilt angle of the axes e1 and e2 of easy magnetization with respect to the X or Y direction is not limited to about 45°. As shown in FIG. 21, the angle can be about 30° to 60°. In this case, the current value of the write current flowing in the first write wiring W1 and the current value of the write current flowing in the second write wiring W2 are different to each other to set in the optimum value. A writing window of the first and second MTJ elements 100 and 200 can be extended.

The first MTJ element 100 has a first fixed layer (pinned layer) 111 whose magnetization is fixed in the uniaxial direction, a first recording layer (free layer) 113 whose magnetization reverses, a first tunnel barrier layer 112 sandwiched between the first fixed layer 111 and the first recording layer 113, and an anti-ferromagnetic layer (not shown) to fix magnetization of the first fixed layer 111. The first recording layer 113 has an anti-ferromagnetic coupling structure including a nonmagnetic layer 113b and ferromagnetic layers (soft magnetic layers) 113a and 113c which sandwich the nonmagnetic layer 113b. The ferromagnetic layers 113a and 113c are magnetically coupled while having reverse magnetization directions. The first recording layer may have a ferromagnetic coupling structure in which the ferromagnetic layers 113a and 113c are magnetically coupled while having the same magnetization direction.

The second MTJ element 200 has a second fixed layer 211 whose magnetization is fixed in the uniaxial direction, a second recording layer 213 whose magnetization reverses, a second tunnel barrier layer 212 sandwiched between the second fixed layer 211 and the second recording layer 213, and an anti-ferromagnetic layer (not shown) to fix magnetization of the second fixed layer 211. The second recording layer 213 has an anti-ferromagnetic coupling structure including a nonmagnetic layer 213b and ferromagnetic layers (soft magnetic layers) 213a and 213c which sandwich the nonmagnetic layer 213b. The ferromagnetic layers 213a and 213c are magnetically coupled while having reverse magnetization directions. The second recording layer may have a ferromagnetic coupling structure in which the ferromagnetic layers 213a and 213c are magnetically coupled while having the same magnetization direction.

The first and second MTJ elements 100 and 200 have a planar shape having long and short sides (e.g., an elliptical shape with an aspect ratio of 2 or more or an oblong shape with round corners). The longitudinal direction of the planar shape matches the direction of the axis e1 or e2 of easy magnetization on the basis of shape anisotropy.

The planar shape of the intermediate electrode 10 is, e.g., rectangular. The area of the planar shape of the intermediate electrode 10 is larger than the area of the planar shape of the first and second MTJ elements 100 and 200.

[1-2] Write Method

As the write method of the magnetic random access memory according to the first embodiment of the present invention, a so-called toggle write method is employed.

The toggle write method is a current magnetic field write method. The first write current is supplied to the first write wiring, and the second write current is supplied to the second write wiring. A magnetic field generated by these currents is applied to the MTJ element, thereby writing binary information in it. One of the first and second write currents is supplied earlier than the other. Then, the other current is supplied in addition to the one current. The value of the one current is reduced to the write threshold value or less earlier than the other current. Then, the Value of the other current is reduced to the write threshold value or less.

With this write operation, the state of data of the selected cell sequentially changes from "1" to "0" to "1" to "0". In other words, by the write, the relative magnetization direction between the storage layer (ferromagnetic layer on the side facing the fixed layer) and the fixed layer (ferromagnetic layer on the side facing the recording layer when the fixed layer includes a plurality of ferromagnetic layers divided by nonmagnetic layers) of the MTJ element changes from the parallel state to the anti-parallel state or from the anti-parallel state to the parallel state.

Hence, before arbitrary data is written in a selected cell, data written in that cell must be read out. If the arbitrary data has already been written, no write is executed. If data different from the arbitrary data has been written, the write is executed to rewrite the data. For example, in writing "0" data in the selected cell, when data read out from the selected cell is "0" data, no write is executed. Only when the data is "1" data, the write is executed. In writing "1" data in the selected cell, when data read out from the selected cell is "1" data, no write is executed. Only when the data is "0" data, the write is executed.

The write method when the above-described confirmation cycle is performed, and consequently, the write operation is necessary, i.e., there is necessity of rewriting the data of the selected cell will be described.

In this embodiment, the two MTJ elements 100 and 200 are present between the pair of write wirings W1 and W2. To rewrite data of only a selected one of the first and second MTJ elements 100 and 200 by the toggle operation, the order of ending or starting supply of the first and second write currents and the directions in which the write currents are supplied are changed, thereby rotating the magnetization of the recording layer of the selected element in one direction. This write method will be described below in detail.

[1-2a] Write in First MTJ Element

The outline of the write method of rewriting only data of the first MTJ element 100 will be described below.

One of the first and second write wirings W1 and W2 is defined as the first selected wiring, and the other is defined as the second selected wiring. The first selected wiring is turned on to supply the write current (first cycle)→the second selected wiring is turned on to supply the write current (second cycle)→the first selected wiring is turned off to stop supplying the write current (third cycle)→the second selected wiring is turned off to stop supplying the write current (fourth cycle). The direction in which the write current is supplied is adjusted such that the application direction of the synthetic field by the write currents in the second cycle matches the direction of the axis e1 of easy magnetization of the first MTJ element 100, thereby rotating the magnetization of the recording layer 113 in one direction (clockwise or counterclockwise). Write Method Examples 1 to 4 of the first MTJ element 100 will be described below.

(a) Write Method Example 1 of First MTJ Element

In Write Method Example 1 of the first MTJ element, the write current supply direction is adjusted such that the application direction of the synthetic field by the write currents in the second cycle matches the direction of the axis e1 of easy magnetization of the first MTJ element 100, i.e., to the upper right of the drawing surface (this direction will be defined as a "45° direction" hereinafter). Data is rewritten while rotating the magnetization of the recording layer 113 "clockwise".

Figure 2:
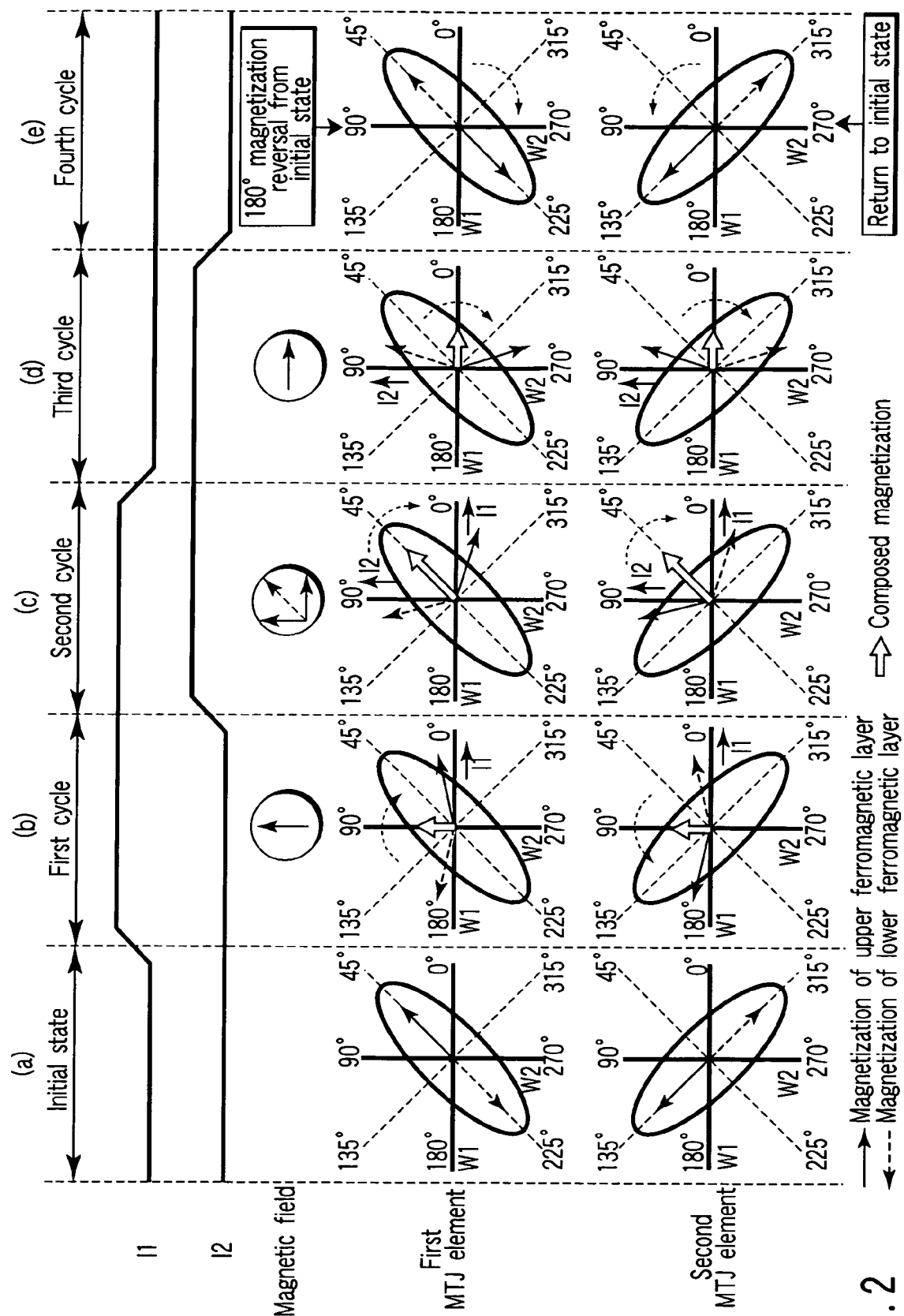
FIG. 2 is an explanatory view of the cycles of Write Method Example 1 of the first MTJ element according to the first embodiment of the present invention.

FIG. 2 is an explanatory view of the cycles of Write Method Example 1 of the first MTJ element according to the first embodiment of the present invention. Write Method Example 1 of the first MTJ element will be described below.

(Initial State)

In the initial state, as indicated by (a) in FIG. 2, both the first and second write wirings W2 are off and set in the no energized state in which neither write current I1 nor I2 flows to them.

In this case, in the recording layer 113 of the first MTJ element 100, the magnetization of the upper ferromagnetic layer 113*c* and that of the lower ferromagnetic layer 113*a* are directed in 180-degree reverse directions because of anti-ferromagnetic coupling. More specifically, magnetization of the upper ferromagnetic layer 113*c* is directed in the 45° direction. Magnetization of the lower ferromagnetic layer 113*a* is directed to the lower left of the drawing surface (this direction will be defined as a "225° direction" hereinafter). Since the magnetizations (magnetic moments) of both ferromagnetic layers balance, composed magnetization (composed magnetic moment) in the recording layer 113 is almost 0 in the initial state.

In the recording layer 213 of the second MTJ element 200, magnetization of the upper ferromagnetic layer 213*c* and that of the lower ferromagnetic layer 213*a* are directed in 180-degree reverse directions because of anti-ferromagnetic coupling. More specifically, magnetization of the upper ferromagnetic layer 213*c* is directed to the upper left of the drawing surface (this direction will be defined as a "135° direction" hereinafter). Magnetization of the lower ferromagnetic layer 213*a* is directed to the lower right of the drawing surface (this direction will be defined as a "315° direction" hereinafter). Since the magnetizations (magnetic moments) of both ferromagnetic layers balance, composed magnetization (composed magnetic moment) in the recording layer 213 is almost 0 in the initial state.

In this embodiment, the initial state is defined as a state in which, e.g., "1" data is written in the first MTJ element 100, and, e.g., "1" data is written in the second MTJ element 200.

(First Cycle)

In the first cycle, as indicated by (b) in FIG. 2, only the first write wiring W1 is turned on to supply the write current I1 to, e.g., the right of the drawing surface (this direction will be defined as a "0° direction" hereinafter). A magnetic field is generated to the upper side of the drawing surface (this direction will be defined as a "90° direction" hereinafter).

In this case, composed magnetization (composed magnetic moment) appears in the recording layer 113 of the first MTJ element 100 due to the magnetic field generated by the write current I1. The composed magnetization rotates clockwise until it is directed in the direction (90° direction) of the generated magnetic field while maintaining the anti-ferromagnetic coupling state between the upper ferromagnetic layer 113*c* and the lower ferromagnetic layer 113*a*.

Composed magnetization (composed magnetic moment) appears in the recording layer 213 of the second MTJ element 200 due to the magnetic field generated by the write current I1. The composed magnetization rotates counterclockwise until it is directed in the direction (90° direction) of the generated magnetic field while maintaining the anti-ferromagnetic coupling state between the upper ferromagnetic layer 213*c* and the lower ferromagnetic layer 213*a*.

(Second Cycle)

In the second cycle, as indicated by (c) in FIG. 2, the first write wiring W1 is kept on to continuously supply the write current I1 in the 0° direction. The second write wiring W2 is also turned on to start supplying the write current I2 in the 90° direction. A synthetic magnetic field is generated in the 45° direction.

In this case, composed magnetization (composed magnetic moment) in the recording layer 113 of the first MTJ element 100 further rotates clockwise until it is directed in the direction (45° direction) of the synthetic field generated by the write currents I1 and I2 while maintaining the anti-ferromagnetic coupling state between the upper ferromagnetic layer 113*c* and the lower ferromagnetic layer 113*a*. Consequently, the composed magnetization (composed magnetic moment) in the recording layer 113 of the first MTJ element 100 is directed in the 45° direction.

Composed magnetization (composed magnetic moment) in the recording layer 213 of the second MTJ element 200 rotates clockwise this time until it is directed in the direction (45° direction) of the synthetic field generated by the write currents I1 and I2 while maintaining the anti-ferromagnetic coupling state between the upper ferromagnetic layer 213*c* and the lower ferromagnetic layer 213*a*. Consequently, the composed magnetization (composed magnetic moment) in the recording layer 213 of the second MTJ element 200 is directed in the 45° direction.

(Third Cycle)

In the third cycle, as indicated by (d) in FIG. 2, the first write wiring W1 is turned off to stop supplying the write current I1. Only the second write wiring W2 is kept on to continuously supply the write current I2 in the 90° direction. A magnetic field is generated in the 0° direction.

In this case, composed magnetization (composed magnetic moment) in the recording layer 113 of the first MTJ element 100 further rotates clockwise until it is directed in the direction (0° direction) of the magnetic field generated by the write current I2 while maintaining the anti-ferromagnetic coupling state between the upper ferromagnetic layer 113*c* and the lower ferromagnetic layer 113*a*. Consequently, the composed magnetization (composed magnetic moment) in the recording layer 113 of the first MTJ element 100 is directed in the 0° direction.

Composed magnetization (composed magnetic moment) in the recording layer 213 of the second MTJ element 200 further rotates clockwise until it is directed in the direction (0° direction) of the magnetic field generated by the write current I2 while maintaining the anti-ferromagnetic coupling state between the upper ferromagnetic layer 213*c* and the lower ferromagnetic layer 213*a*. Consequently, the composed magnetization (composed magnetic moment) in the recording layer 213 of the second MTJ element 200 is directed in the 0° direction.

(Fourth Cycle)

In the fourth cycle, as indicated by (e) in FIG. 2, both the first write wiring W1 and second write wiring W2 are turned off to stop supplying the write currents I1 and I2 to them. Hence, in the fourth cycle, the applied magnetic fields disappear.

In this case, the magnetizations of the upper ferromagnetic layer 113c and lower ferromagnetic layer 113a of the first MTJ element 100 return to the stable state in the 45° and 225° directions (direction of the axis e1 of easy magnetization). More specifically, the magnetizations of the upper ferromagnetic layer 113c and lower ferromagnetic layer 113a further rotate clockwise. The magnetization of the upper ferromagnetic layer 113c is directed in the 225° direction. The magnetization of the lower ferromagnetic layer 113a is directed in the 45° direction. The magnetization of the upper ferromagnetic layer 113c and that of the lower ferromagnetic layer 113a are directed in 180-degree reverse directions. Since their magnetizations (magnetic moments) balance, composed magnetization (composed magnetic moment) in the recording layer 113 is almost 0. The magnetization in the recording layer 113 of the first MTJ element 100 is directed in the direction rotated 180° from the initial state. Hence, the data of the first MTJ element 100 can be rewritten from "1" to "0".

The magnetizations of the upper ferromagnetic layer 213c and lower ferromagnetic layer 213a of the second MTJ element 200 return to the stable state in the 135° and 315° directions (direction of the axis e1 of easy magnetization). More specifically, the magnetizations of the upper ferromagnetic layer 213c and lower ferromagnetic layer 213a rotate counterclockwise. The magnetization of the upper ferromagnetic layer 213c is directed in the 135° direction. The magnetization of the lower ferromagnetic layer 213a is directed in the 315° direction. The magnetization of the upper ferromagnetic layer 213c and that of the lower ferromagnetic layer 213a are directed in 180° reverse directions. Since their magnetizations (magnetic moments) balance, composed magnetization (composed magnetic moment) in the recording layer 213 is almost 0. The magnetization in the recording layer 213 of the second MTJ element 200 is directed in the same direction as in the initial state. The data of the second MTJ element 200 remains "1" and is not rewritten.

(b) Write Method Example 2 of First MTJ Element

In Write Method Example 2 of the first MTJ element, the write current supply direction is adjusted such that the application direction of the synthetic field by the write currents in the second cycle matches the direction of the axis e1 of easy magnetization of the first MTJ element 100, i.e., "1225° direction". Data is rewritten while rotating the magnetization of the recording layer 113 "clockwise".

Figure 3:
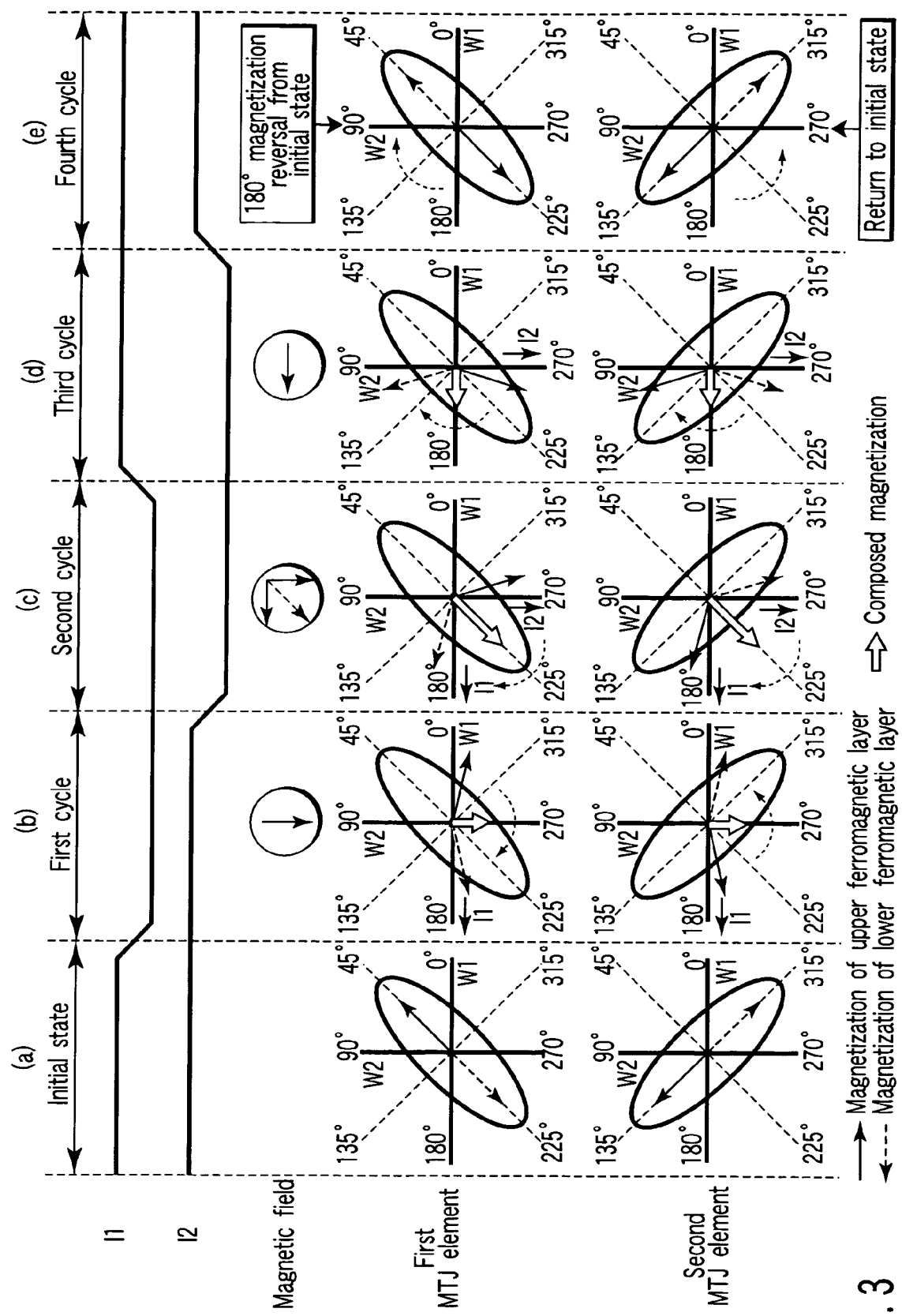
FIG. 3 is an explanatory view of the cycles of Write Method Example 2 of the first MTJ element according to the first embodiment of the present invention.

FIG. 3 is an explanatory view of the cycles of Write Method Example 2 of the first MTJ element according to the first embodiment of the present invention. Write Method Example 2 of the first MTJ element will be described below.

(Initial State)

In the initial state, as indicated by (a) in FIG. 3, both the first and second write wirings W2 are off and set in the no energized state in which neither write current I1 nor I2 flows to them.

In this case, as in (a) in FIG. 2, the magnetizations of the upper ferromagnetic layer 113c and lower ferromagnetic layer 113a of the first MTJ element 100 are directed in the 45° and 225° directions. The magnetizations of the upper ferromagnetic layer 213c and lower ferromagnetic layer 213a of the second MTJ element 200 are directed in the 135° and 315° directions.

(First Cycle)

In the first cycle, as indicated by (b) in FIG. 3, only the first write wiring W1 is turned on to supply the write current I1 in, e.g., the 180° direction. A magnetic field is generated in the 270° direction.

In this case, composed magnetization (composed magnetic moment) appears in the recording layer 113 of the first MTJ element 100 due to the magnetic field generated by the write current I1. The composed magnetization rotates clockwise until it is directed in the direction (270° direction) of the generated magnetic field while maintaining the anti-ferromagnetic coupling state between the upper ferromagnetic layer 113c and the lower ferromagnetic layer 113a.

Composed magnetization (composed magnetic moment) appears in the recording layer 213 of the second MTJ element 200 due to the magnetic field generated by the write current I1. The composed magnetization rotates counterclockwise until it is directed in the direction (270° direction) of the generated magnetic field while maintaining the anti-ferromagnetic coupling state between the upper ferromagnetic layer 213c and the lower ferromagnetic layer 213a.

(Second Cycle)

In the second cycle, as indicated by (c) in FIG. 3, the first write wiring W1 is kept on to continuously supply the write current I1 in the 180° direction. The second write wiring W2 is also turned on to start supplying the write current I2 in the 270° direction. A synthetic magnetic field is generated in the 225° direction.

In this case, composed magnetization (composed magnetic moment) in the recording layer 113 of the first MTJ element 100 further rotates clockwise until it is directed in the direction (225° direction) of the synthetic field generated by the write currents I1 and I2 while maintaining the anti-ferromagnetic coupling state between the upper ferromagnetic layer 113c and the lower ferromagnetic layer 113a. Consequently, the composed magnetization (composed magnetic moment) in the recording layer 113 of the first MTJ element 100 is directed in the 225° direction.

Composed magnetization (composed magnetic moment) in the recording layer 213 of the second MTJ element 200 rotates clockwise this time until it is directed in the direction (225° direction) of the synthetic field generated by the write currents I1 and I2 while maintaining the anti-ferromagnetic coupling state between the upper ferromagnetic layer 213c and the lower ferromagnetic layer 213a. Consequently, the composed magnetization (composed magnetic moment) in the recording layer 213 of the second MTJ element 200 is directed in the 225° direction.

(Third Cycle)

In the third cycle, as indicated by (d) in FIG. 3, the first write wiring W1 is turned off to stop supplying the write current I1. Only the second write wiring W2 is kept on to continuously supply the write current I2 in the 270° direction. A magnetic field is generated in the 180° direction.

In this case, composed magnetization (composed magnetic moment) in the recording layer 113 of the first MTJ element 100 further rotates clockwise until it is directed in the direction (180° direction) of the magnetic field generated by the write current I2 while maintaining the anti-ferromagnetic coupling state between the upper ferromagnetic layer 113c and the lower ferromagnetic layer 113a. Consequently, the composed magnetization (composed magnetic moment)

in the recording layer 113 of the first MTJ element 100 is directed in the 180° direction.

Composed magnetization (composed magnetic moment) in the recording layer 213 of the second MTJ element 200 further rotates clockwise until it is directed in the direction (180° direction) of the magnetic field generated by the write current I2 while maintaining the anti-ferromagnetic coupling state between the upper ferromagnetic layer 213c and the lower ferromagnetic layer 213a. Consequently, the composed magnetization (composed magnetic moment) in the recording layer 213 of the second MTJ element 200 is directed in the 180° direction.

(Fourth Cycle)

In the fourth cycle, as indicated by (e) in FIG. 3, both the first write wiring W1 and second write wiring W2 are turned off to stop supplying the write currents I1 and I2 to them. Hence, in the fourth cycle, the applied magnetic fields disappear.

In this case, the magnetizations of the upper ferromagnetic layer 113c and lower ferromagnetic layer 113a of the first MTJ element 100 return to the stable state in the 45° and 225° directions (direction of the axis e1 of easy magnetization). More specifically, the magnetizations of the upper ferromagnetic layer 113c and lower ferromagnetic layer 113a further rotate clockwise. The magnetization of the upper ferromagnetic layer 113c is directed in the 225° direction. The magnetization of the lower ferromagnetic layer 113a is directed in the 45° direction. The magnetization in the recording layer 113 of the first MTJ element 100 is directed in the direction rotated 180° from the initial state. Hence, the data of the first MTJ element 100 can be rewritten from "1" to "0".

The magnetizations of the upper ferromagnetic layer 213c and lower ferromagnetic layer 213a of the second MTJ element 200 return to the stable state in the 135° and 315° directions (direction of the axis e1 of easy magnetization). More specifically, the magnetizations of the upper ferromagnetic layer 213c and lower ferromagnetic layer 213a rotate counterclockwise. The magnetization of the upper ferromagnetic layer 213c is directed in the 135° direction. The magnetization of the lower ferromagnetic layer 213a is directed in the 315° direction. The magnetization in the recording layer 213 of the second MTJ element 200 is directed in the same direction as in the initial state. The data of the second MTJ element 200 remains "1" and is not rewritten.

(c) Write Method Example 3 of First MTJ Element

In Write Method Example 3 of the first MTJ element, the write current supply direction is adjusted such that the application direction of the synthetic field by the write currents in the second cycle matches the direction of the axis e1 of easy magnetization of the first MTJ element 100, i.e., "45° direction". Data is rewritten while rotating the magnetization of the recording layer 113 "counterclockwise".

Figure 4:
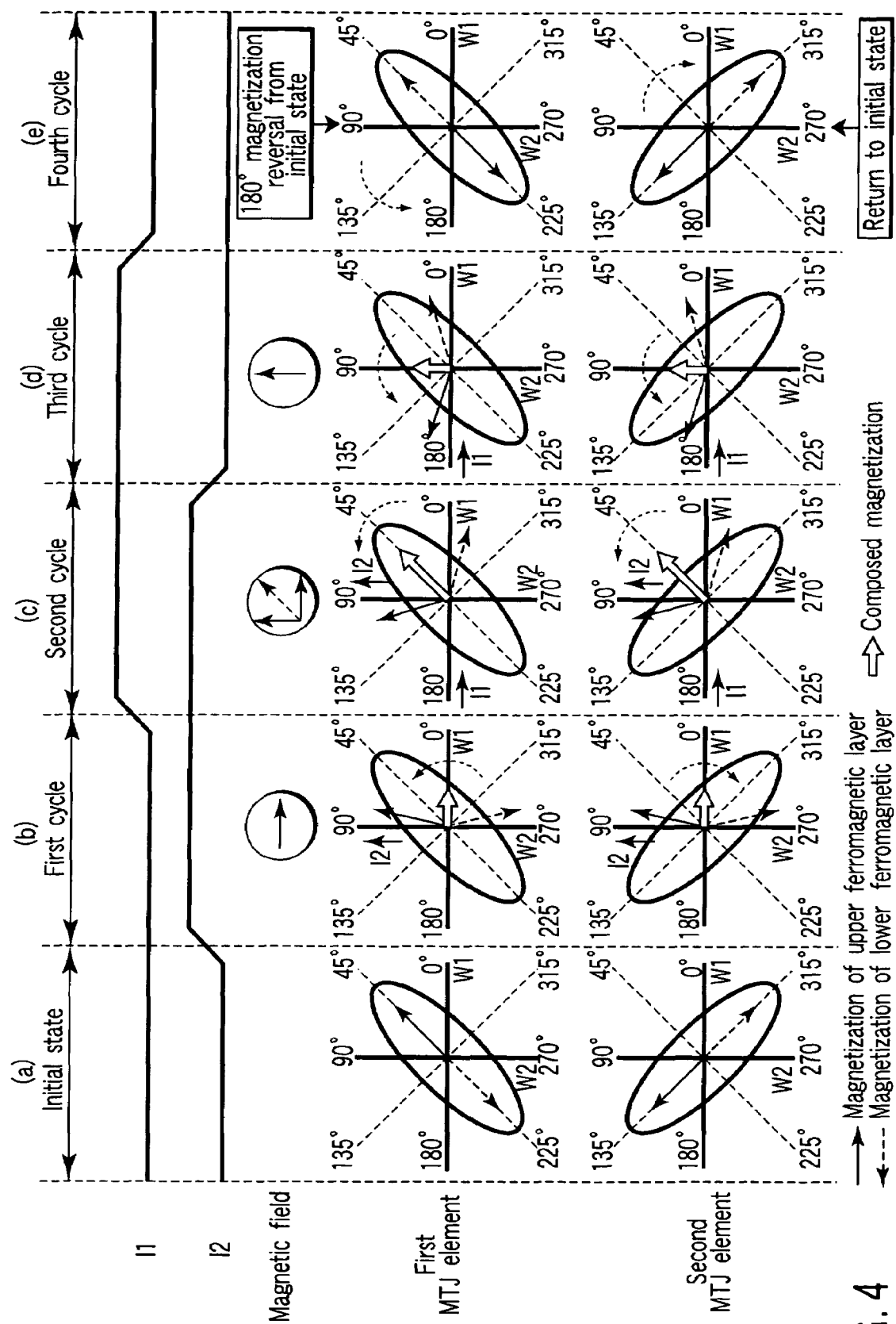
FIG. 4 is an explanatory view of the cycles of Write Method Example 3 of the first MTJ element according to the first embodiment of the present invention.

FIG. 4 is an explanatory view of the cycles of Write Method Example 3 of the first MTJ element according to the first embodiment of the present invention. Write Method Example 3 of the first MTJ element will be described below.

(Initial State)

In the initial state, as indicated by (a) in FIG. 4, both the first and second write wirings W2 are off and set in the no energized state in which neither write current I1 nor I2 flows to them.

In this case, as in (a) in FIG. 2, the magnetizations of the upper ferromagnetic layer 113c and lower ferromagnetic layer 113a of the first MTJ element 100 are directed in the 45° and 225° directions. The magnetizations of the upper ferromagnetic layer 213c and lower ferromagnetic layer 213a of the second MTJ element 200 are directed in the 135° and 315° directions.

(First Cycle)

In the first cycle, as indicated by (b) in FIG. 4, only the second write wiring W2 is turned on to supply the write current I2 in, e.g., the 90° direction. A magnetic field is generated in the 0° direction.

In this case, composed magnetization (composed magnetic moment) appears in the recording layer 113 of the first MTJ element 100 due to the magnetic field generated by the write current I2. The composed magnetization rotates counterclockwise until it is directed in the direction (0° direction) of the generated magnetic field while maintaining the anti-ferromagnetic coupling state between the upper ferromagnetic layer 113c and the lower ferromagnetic layer 113a.

Composed magnetization (composed magnetic moment) appears in the recording layer 213 of the second MTJ element 200 due to the magnetic field generated by the write current I2. The composed magnetization rotates clockwise until it is directed in the direction (0° direction) of the generated magnetic field while maintaining the anti-ferromagnetic coupling state between the upper ferromagnetic layer 213c and the lower ferromagnetic layer 213a.

(Second Cycle)

In the second cycle, as indicated by (c) in FIG. 4, the second write wiring W2 is kept on to continuously supply the write current I2 in the 90° direction. The first write wiring W1 is also turned on to start supplying the write current I1 in the 0° direction. A synthetic magnetic field is generated in the 45° direction.

In this case, composed magnetization (composed magnetic moment) in the recording layer 113 of the first MTJ element 100 rotates counterclockwise until it is directed in the direction (45° direction) of the synthetic field generated by the write currents I1 and I2 while maintaining the anti-ferromagnetic coupling state between the upper ferromagnetic layer 113c and the lower ferromagnetic layer 113a. Consequently, the composed magnetization (composed magnetic moment) in the recording layer 113 of the first MTJ element 100 is directed in the 45° direction.

Composed magnetization (composed magnetic moment) in the recording layer 213 of the second MTJ element 200 rotates counterclockwise this time until it is directed in the direction (45° direction) of the synthetic field generated by the write currents I1 and I2 while maintaining the anti-ferromagnetic coupling state between the upper ferromagnetic layer 213c and the lower ferromagnetic layer 213a. Consequently, the composed magnetization (composed magnetic moment) in the recording layer 213 of the second MTJ element 200 is directed in the 45° direction.

(Third Cycle)

In the third cycle, as indicated by (d) in FIG. 4, the second write wiring W2 is turned off to stop supplying the write current I2. Only the first write wiring W1 is kept on to continuously supply the write current I1 in the 0° direction. A magnetic field is generated in the 90° direction.

In this case, composed magnetization (composed magnetic moment) in the recording layer 113 of the first MTJ element 100 further rotates counterclockwise until it is directed in the direction (90° direction) of the magnetic field generated by the write current I1 while maintaining the anti-ferromagnetic coupling state between the upper ferromagnetic layer 113c and the lower ferromagnetic layer 113a. Consequently, the composed magnetization (composed magnetic moment) in the recording layer 113 of the first MTJ element 100 is directed in the 90° direction.

Composed magnetization (composed magnetic moment) in the recording layer 213 of the second MTJ element 200 further rotates counterclockwise until it is directed in the direction (90° direction) of the magnetic field generated by the write current I1 while maintaining the anti-ferromagnetic coupling state between the upper ferromagnetic layer 213c and the lower ferromagnetic layer 213a. Consequently, the composed magnetization (composed magnetic moment) in the recording layer 213 of the second MTJ element 200 is directed in the 90° direction.

(Fourth Cycle)

In the fourth cycle, as indicated by (e) in FIG. 4, both the first write wiring W1 and second write wiring W2 are turned off to stop supplying the write currents I1 and I2 to them. Hence, in the fourth cycle, the applied magnetic fields disappear.

In this case, the magnetizations of the upper ferromagnetic layer 113c and lower ferromagnetic layer 113a of the first MTJ element 100 return to the stable state in the 45° and 225° directions (direction of the axis e1 of easy magnetization). More specifically, the magnetizations of the upper ferromagnetic layer 113c and lower ferromagnetic layer 113a further rotate counterclockwise. The magnetization of the upper ferromagnetic layer 113c is directed in the 45° direction. The magnetization of the lower ferromagnetic layer 113a is directed in the 225° direction. The magnetization in the recording layer 113 of the first MTJ element 100 is directed in the direction rotated 180° from the initial state. Hence, the data of the first MTJ element 100 can be rewritten from "1" to "0".

The magnetizations of the upper ferromagnetic layer 213c and lower ferromagnetic layer 213a of the second MTJ element 200 return to the stable state in the 135° and 315° directions (direction of the axis e1 of easy magnetization). More specifically, the magnetizations of the upper ferromagnetic layer 213c and lower ferromagnetic layer 213a rotate clockwise. The magnetization of the upper ferromagnetic layer 213c is directed in the 315° direction. The magnetization of the lower ferromagnetic layer 213a is directed in the 135° direction. The magnetization in the recording layer 213 of the second MTJ element 200 is directed in the same direction as in the initial state. The data of the second MTJ element 200 remains "1" and is not rewritten.

(d) Write Method Example 4 of First MTJ Element

In Write Method Example 4 of the first MTJ element, the write current supply direction is adjusted such that the application direction of the synthetic field by the write currents in the second cycle matches the direction of the axis e1 of easy magnetization of the first MTJ element 100, i.e., "225° direction". Data is rewritten while rotating the magnetization of the recording layer 113 "counterclockwise".

Figure 5:
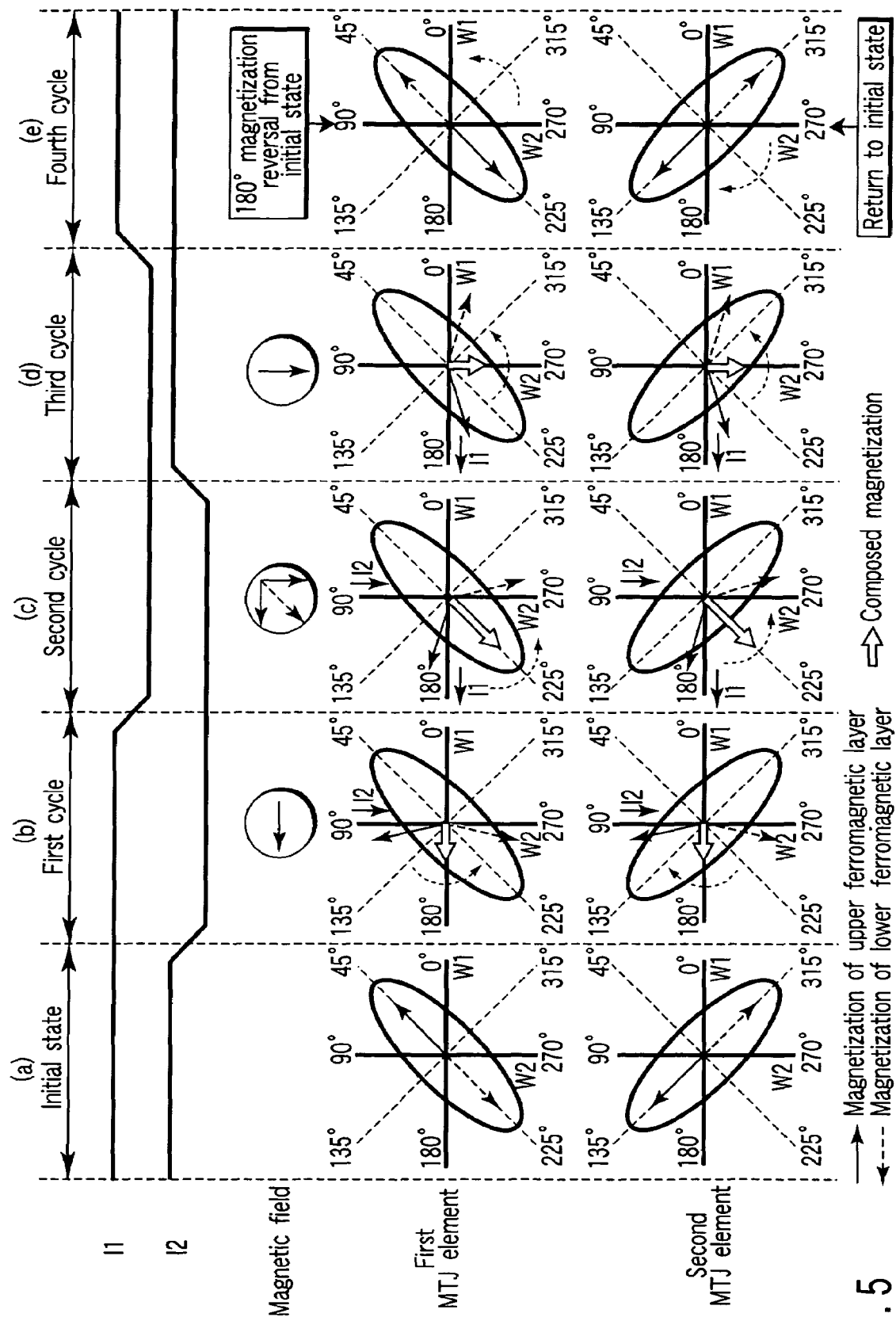
FIG. 5 is an explanatory view of the cycles of Write Method Example 4 of the first MTJ element according to the first embodiment of the present invention.

FIG. 5 is an explanatory view of the cycles of Write Method Example 4 of the first MTJ element according to the first embodiment of the present invention. Write Method Example 4 of the first MTJ element will be described below.

(Initial State)

In the initial state, as indicated by (a) in FIG. 5, both the first and second write wirings W2 are off and set in the no energized state in which neither write current I1 nor I2 flows to them.

In this case, as in (a) in FIG. 2, the magnetizations of the upper ferromagnetic layer 113c and lower ferromagnetic layer 113a of the first MTJ element 100 are directed in the 45° and 225° directions. The magnetizations of the upper ferromagnetic layer 213c and lower ferromagnetic layer 213a of the second MTJ element 200 are directed in the 135° and 315° directions.

(First Cycle)

In the first cycle, as indicated by (b) in FIG. 5, only the second write wiring W2 is turned on to supply the write current I2 in, e.g., the 270° direction. A magnetic field is generated in the 180° direction.

In this case, composed magnetization (composed magnetic moment) appears in the recording layer 113 of the first MTJ element 100 due to the magnetic field generated by the write current I2. The composed magnetization rotates counterclockwise until it is directed in the direction (180° direction) of the generated magnetic field while maintaining the anti-ferromagnetic coupling state between the upper ferromagnetic layer 113c and the lower ferromagnetic layer 113a.

Composed magnetization (composed magnetic moment) appears in the recording layer 213 of the second MTJ element 200 due to the magnetic field generated by the write current I2. The composed magnetization rotates clockwise until it is directed in the direction (180° direction) of the generated magnetic field while maintaining the anti-ferromagnetic coupling state between the upper ferromagnetic layer 213c and the lower ferromagnetic layer 213a.

(Second Cycle)

In the second cycle, as indicated by (c) in FIG. 5, the second write wiring W2 is kept on to continuously supply the write current I2 in the 270° direction. The first write wiring W1 is also turned on to start supplying the write current I1 in the 180° direction. A synthetic magnetic field is generated in the 225° direction.

In this case, composed magnetization (composed magnetic moment) in the recording layer 113 of the first MTJ element 100 further rotates counterclockwise until it is directed in the direction (225° direction) of the synthetic field generated by the write currents I1 and I2 while maintaining the anti-ferromagnetic coupling state between the upper ferromagnetic layer 113c and the lower ferromagnetic layer 113a. Consequently, the composed magnetization (composed magnetic moment) in the recording layer 113 of the first MTJ element 100 is directed in the 225° direction.

Composed magnetization (composed magnetic moment) in the recording layer 213 of the second MTJ element 200 rotates counterclockwise this time until it is directed in the direction (225° direction) of the synthetic field generated by the write currents I1 and I2 while maintaining the anti-ferromagnetic coupling state between the upper ferromagnetic layer 213c and the lower ferromagnetic layer 213a. Consequently, the composed magnetization (composed magnetic moment) in the recording layer 213 of the second MTJ element 200 is directed in the 225° direction.

(Third Cycle)

In the third cycle, as indicated by (d) in FIG. 5, the second write wiring W2 is turned off to stop supplying the write current I2. Only the first write wiring W1 is kept on to continuously supply the write current I1 in the 180° direction. A magnetic field is generated in the 270° direction.

In this case, composed magnetization (composed magnetic moment) in the recording layer 113 of the first MTJ element 100 further rotates counterclockwise until it is directed in the direction (270° direction) of the magnetic field generated by the write current I1 while maintaining the anti-ferromagnetic coupling state between the upper ferromagnetic layer 113c and the lower ferromagnetic layer 113a. Consequently, the composed magnetization (composed magnetic moment) in the recording layer 113 of the first MTJ element 100 is directed in the 270° direction.

Composed magnetization (composed magnetic moment) in the recording layer 213 of the second MTJ element 200 further rotates counterclockwise until it is directed in the direction (270° direction) of the magnetic field generated by the write current I1 while maintaining the anti-ferromagnetic coupling state between the upper ferromagnetic layer 213c and the lower ferromagnetic layer 213a. Consequently, the composed magnetization (composed magnetic moment) in the recording layer 213 of the second MTJ element 200 is directed in the 270° direction.

(Fourth Cycle)

In the fourth cycle, as indicated by (e) in FIG. 5, both the first write wiring W1 and second write wiring W2 are turned off to stop supplying the write currents I1 and I2 to them. Hence, in the fourth cycle, the applied magnetic fields disappear.

In this case, the magnetizations of the upper ferromagnetic layer 113c and lower ferromagnetic layer 113a of the first MTJ element 100 return to the stable state in the 45° and 225° directions (direction of the axis e1 of easy magnetization). More specifically, the magnetizations of the upper ferromagnetic layer 113c and lower ferromagnetic layer 113a further rotate counterclockwise. The magnetization of the upper ferromagnetic layer 113c is directed in the 225° direction. The magnetization of the lower ferromagnetic layer 113a is directed in the 45° direction. The magnetization in the recording layer 113 of the first MTJ element 100 is directed in the direction rotated 180° from the initial state. Hence, the data of the first MTJ element 100 can be rewritten from "1" to "0".

The magnetizations of the upper ferromagnetic layer 213c and lower ferromagnetic layer 213a of the second MTJ element 200 return to the stable state in the 135° and 315° directions (direction of the axis e1 of easy magnetization). More specifically, the magnetizations of the upper ferromagnetic layer 213c and lower ferromagnetic layer 213a rotate clockwise. The magnetization of the upper ferromagnetic layer 213c is directed in the 135° direction. The magnetization of the lower ferromagnetic layer 213a is directed in the 315° direction. The magnetization in the recording layer 213 of the second MTJ element 200 is directed in the same direction as in the initial state. The data of the second MTJ element 200 remains "1" and is not rewritten.

[1-2b] Write in Second MTJ Element

The outline of the write method of rewriting only data of the second MTJ element 200 will be described below.

One of the first and second write wirings W1 and W2 is defined as the first selected wiring, and the other is defined as the second selected wiring. The first selected wiring is turned on to supply the write current (first cycle)→the second selected wiring is turned on to supply the write current (second cycle)→the first selected wiring is turned off to stop supplying the write current (third cycle)→the second selected wiring is turned off to stop supplying the write current (fourth cycle). The direction in which the write current is supplied is adjusted such that the application direction of the synthetic field by the write currents in the second cycle matches the direction of the axis e2 of easy magnetization of the second MTJ element 200, thereby rotating the magnetization of the recording layer 213 in one direction (clockwise or counterclockwise). Write Method Examples 1 to 4 of the second MTJ element 200 will be described below.

(a) Write Method Example 1 of Second MTJ Element

In Write Method Example 1 of the second MTJ element, the write current supply direction is adjusted such that the application direction of the synthetic field by the write currents in the second cycle matches the direction of the axis e2 of easy magnetization of the second MTJ element 200, i.e., "315° direction". Data is rewritten while rotating the magnetization of the recording layer 213 "clockwise".

Figure 6:
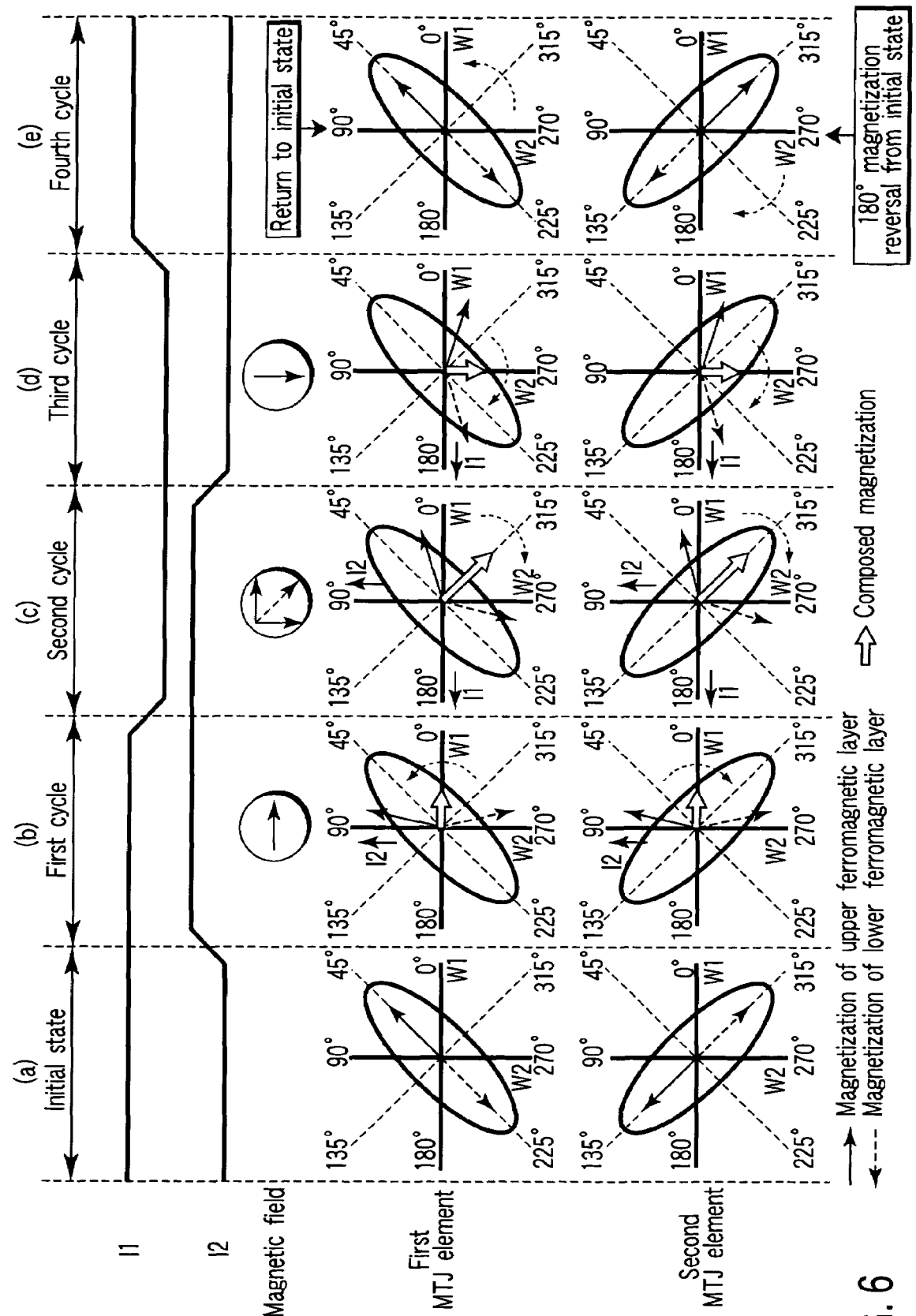
FIG. 6 is an explanatory view of the cycles of Write Method Example 1 of the second MTJ element according to the first embodiment of the present invention.

FIG. 6 is an explanatory view of the cycles of Write Method Example 1 of the second MTJ element according to the first embodiment of the present invention. Write Method Example 1 of the second MTJ element will be described below.

(Initial State)

In the initial state, as indicated by (a) in FIG. 6, both the first and second write wirings W2 are off and set in the no energized state in which neither write current I1 nor I2 flows to them.

In this case, as in (a) in FIG. 2, the magnetizations of the upper ferromagnetic layer 113c and lower ferromagnetic layer 113a of the first MTJ element 100 are directed in the 45° and 225° directions. The magnetizations of the upper ferromagnetic layer 213c and lower ferromagnetic layer 213a of the second MTJ element 200 are directed in the 135° and 315° directions.

(First Cycle)

In the first cycle, as indicated by (b) in FIG. 6, only the second write wiring W2 is turned on to supply the write current I2 in, e.g., the 90° direction. A magnetic field is generated in the 0° direction.

In this case, composed magnetization (composed magnetic moment) appears in the recording layer 213 of the second MTJ element 200 due to the magnetic field generated by the write current I2. The composed magnetization rotates clockwise until it is directed in the direction (0° direction) of the generated magnetic field while maintaining the anti-ferromagnetic coupling state between the upper ferromagnetic layer 213c and the lower ferromagnetic layer 213a.

Composed magnetization (composed magnetic moment) appears in the recording layer 113 of the first MTJ element 100 due to the magnetic field generated by the write current I2. The composed magnetization rotates counterclockwise until it is directed in the direction (0° direction) of the generated magnetic field while maintaining the anti-ferromagnetic coupling state between the upper ferromagnetic layer 113c and the lower ferromagnetic layer 113a.

(Second Cycle)

In the second cycle, as indicated by (c) in FIG. 6, the second write wiring W2 is kept on to continuously supply the write current I2 in the 90° direction. The first write wiring W1 is also turned on to start supplying the write current I1 to the left of the drawing surface (this direction will be defined as a "180° direction" hereinafter). A synthetic magnetic field is generated in the 315° direction.

In this case, composed magnetization (composed magnetic moment) in the recording layer 213 of the second MTJ element 200 further rotates clockwise until it is directed in the direction (315° direction) of the synthetic field generated by the write currents I1 and I2 while maintaining the anti-ferromagnetic coupling state between the upper ferromagnetic layer 213c and the lower ferromagnetic layer 213a. Consequently, the composed magnetization (composed magnetic moment) in the recording layer 213 of the second MTJ element 200 is directed in the 315° direction.

Composed magnetization (composed magnetic moment) in the recording layer 113 of the first MTJ element 100 rotates clockwise this time until it is directed in the direction (315° direction) of the synthetic field generated by the write currents I1 and I2 while maintaining the anti-ferromagnetic coupling state between the upper ferromagnetic layer 113c and the lower ferromagnetic layer 113a. Consequently, the composed magnetization (composed magnetic moment) in the recording layer 113 of the first MTJ element 100 is directed in the 315° direction.

(Third Cycle)

In the third cycle, as indicated by (d) in FIG. 6, the second write wiring W2 is turned off to stop supplying the write current I2. Only the first write wiring W1 is kept on to continuously supply the write current I1 in the 180° direction. A magnetic field is generated to the lower side of the drawing surface (this direction will be defined as a "270° direction" hereinafter).

In this case, composed magnetization (composed magnetic moment) in the recording layer 213 of the second MTJ element 200 further rotates clockwise until it is directed in the direction (270° direction) of the magnetic field generated by the write current I1 while maintaining the anti-ferromagnetic coupling state between the upper ferromagnetic layer 213c and the lower ferromagnetic layer 213a. Consequently, the composed magnetization (composed magnetic moment) in the recording layer 213 of the second MTJ element 200 is directed in the 270° direction.

Composed magnetization (composed magnetic moment) in the recording layer 113 of the first MTJ element 100 further rotates clockwise until it is directed in the direction (270° direction) of the magnetic field generated by the write current I1 while maintaining the anti-ferromagnetic coupling state between the upper ferromagnetic layer 113c and the lower ferromagnetic layer 113a. Consequently, the composed magnetization (composed magnetic moment) in the recording layer 113 of the first MTJ element 100 is directed in the 270° direction.

(Fourth Cycle)

In the fourth cycle, as indicated by (e) in FIG. 6, both the first write wiring W1 and second write wiring W2 are turned off to stop supplying the write currents I1 and I2 to them. Hence, in the fourth cycle, the applied magnetic fields disappear.

In this case, the magnetizations of the upper ferromagnetic layer 213c and lower ferromagnetic layer 213a of the second MTJ element 200 return to the stable state in the 135° and 315° directions (direction of the axis e2 of easy magnetization). More specifically, the magnetizations of the upper ferromagnetic layer 213c and lower ferromagnetic layer 213a further rotate clockwise. The magnetization of the upper ferromagnetic layer 213c is directed in the 315° direction. The magnetization of the lower ferromagnetic layer 213a is directed in the 135° direction. The magnetization in the recording layer 213 of the second MTJ element 200 is directed in the direction rotated 180° from the initial state. Hence, the data of the second MTJ element 200 can be rewritten from "1" to "0".

The magnetizations of the upper ferromagnetic layer 113c and lower ferromagnetic layer 113a of the first MTJ element 100 return to the stable state in the 45° and 225° directions (direction of the axis e2 of easy magnetization). More specifically, the magnetizations of the upper ferromagnetic layer 113c and lower ferromagnetic layer 113a rotate counterclockwise. The magnetization of the upper ferromagnetic layer 113c is directed in the 45° direction. The magnetization of the lower ferromagnetic layer 113a is directed in the 225° direction. The magnetization in the recording layer 113 of the first MTJ element 100 is directed in the same direction as in the initial state. The data of the first MTJ element 100 remains "1" and is not rewritten.

(b) Write Method Example 2 of Second MTJ Element

In Write Method Example 2 of the second MTJ element, the write current supply direction is adjusted such that the application direction of the synthetic field by the write currents in the second cycle matches the direction of the axis e2 of easy magnetization of the second MTJ element 200, i.e., "135° direction". Data is rewritten while rotating the magnetization of the recording layer 213 "clockwise".

Figure 7:
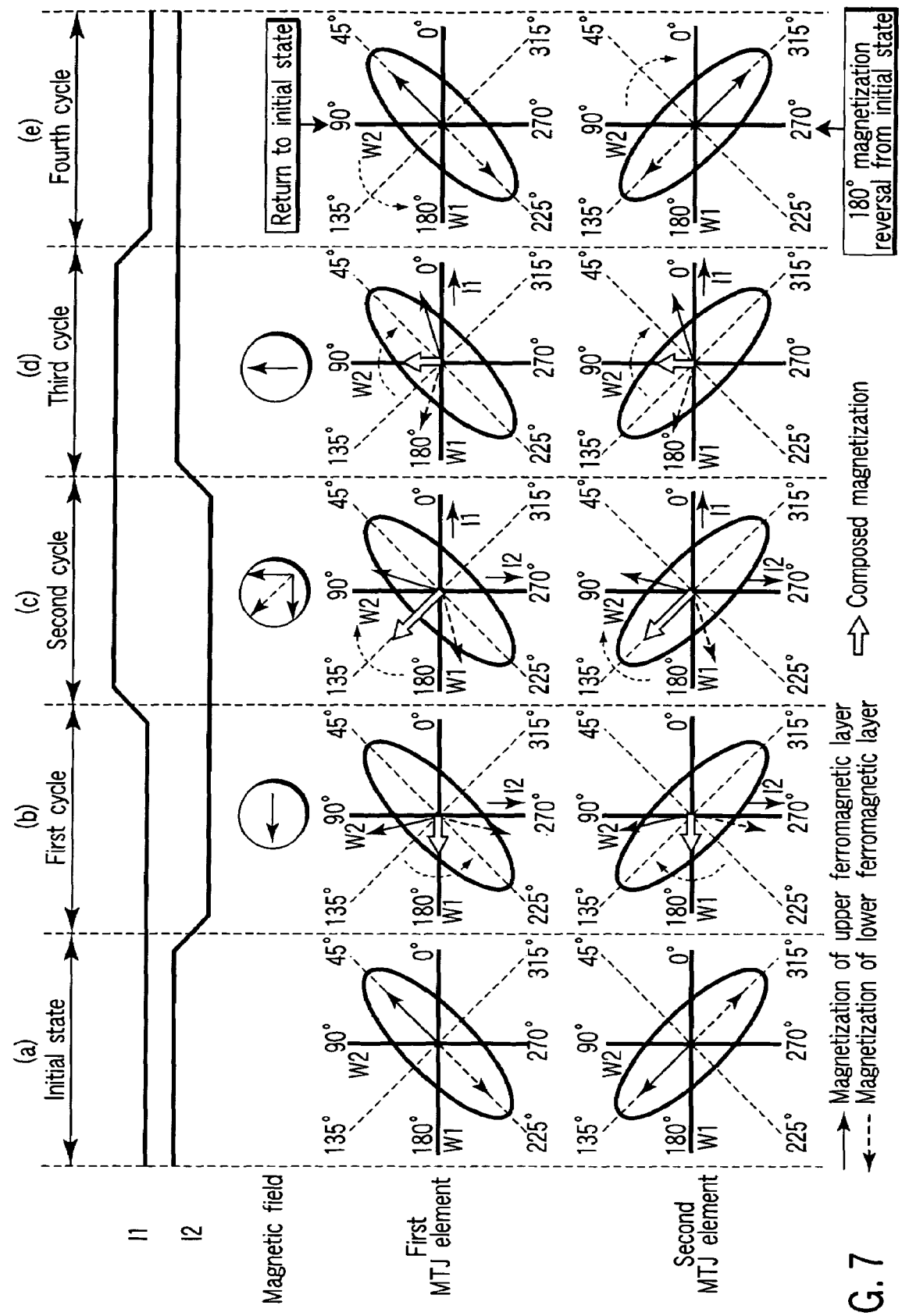
FIG. 7 is an explanatory view of the cycles of Write Method Example 2 of the second MTJ element according to the first embodiment of the present invention.

FIG. 7 is an explanatory view of the cycles of Write Method Example 2 of the second MTJ element according to the first embodiment of the present invention. Write Method Example 2 of the second MTJ element will be described below.

(Initial State)

In the initial state, as indicated by (a) in FIG. 7, both the first and second write wirings W2 are off and set in the no energized state in which neither write current I1 nor I2 flows to them.

In this case, as in (a) in FIG. 2, the magnetizations of the upper ferromagnetic layer 113c and lower ferromagnetic layer 113a of the first MTJ element 100 are directed in the 45° and 225° directions. The magnetizations of the upper ferromagnetic layer 213c and lower ferromagnetic layer 213a of the second MTJ element 200 are directed in the 135° and 315° directions.

(First Cycle)

In the first cycle, as indicated by (b) in FIG. 7, only the second write wiring W2 is turned on to supply the write current I2 in, e.g., the 270° direction. A magnetic field is generated in the 180° direction.

In this case, composed magnetization (composed magnetic moment) appears in the recording layer 213 of the second MTJ element 200 due to the magnetic field generated by the write current I2. The composed magnetization rotates clockwise until it is directed in the direction (180° direction) of the generated magnetic field while maintaining the anti-ferromagnetic coupling state between the upper ferromagnetic layer 213c and the lower ferromagnetic layer 213a.

Composed magnetization (composed magnetic moment) appears in the recording layer 113 of the first MTJ element 100 due to the magnetic field generated by the write current I2. The composed magnetization rotates counterclockwise until it is directed in the direction (180° direction) of the generated magnetic field while maintaining the anti-ferromagnetic coupling state between the upper ferromagnetic layer 113c and the lower ferromagnetic layer 113a.

(Second Cycle)

In the second cycle, as indicated by (c) in FIG. 7, the second write wiring W2 is kept on to continuously supply the write current I2 in the 270° direction. The first write wiring W1 is also turned on to start supplying the write current I1 in the 0° direction. A synthetic magnetic field is generated in the 135° direction.

In this case, composed magnetization (composed magnetic moment) in the recording layer 213 of the second MTJ element 200 further rotates clockwise until it is directed in the direction (135° direction) of the synthetic field generated by the write currents I1 and I2 while maintaining the anti-ferromagnetic coupling state between the upper ferromagnetic layer 213c and the lower ferromagnetic layer 213a. Consequently, the composed magnetization (composed magnetic moment) in the recording layer 213 of the second MTJ element 200 is directed in the 135° direction.

Composed magnetization (composed magnetic moment) in the recording layer 113 of the first MTJ element 100 rotates clockwise this time until it is directed in the direction (135° direction) of the synthetic field generated by the write currents I1 and I2 while maintaining the anti-ferromagnetic coupling state between the upper ferromagnetic layer 113c and the lower ferromagnetic layer 113a. Consequently, the composed magnetization (composed magnetic moment) in the recording layer 113 of the first MTJ element 100 is directed in the 135° direction.

(Third Cycle)

In the third cycle, as indicated by (d) in FIG. 7, the second write wiring W2 is turned off to stop supplying the write current I2. Only the first write wiring W1 is kept on to continuously supply the write current I1 in the 0° direction. A magnetic field is generated in the 90° direction.

In this case, composed magnetization (composed magnetic moment) in the recording layer 213 of the second MTJ element 200 further rotates clockwise until it is directed in the direction (90° direction) of the magnetic field generated by the write current I1 while maintaining the anti-ferromagnetic coupling state between the upper ferromagnetic layer 213c and the lower ferromagnetic layer 213a. Consequently, the composed magnetization (composed magnetic moment) in the recording layer 213 of the second MTJ element 200 is directed in the 90° direction.

Composed magnetization (composed magnetic moment) in the recording layer 113 of the first MTJ element 100 further rotates clockwise until it is directed in the direction (90° direction) of the magnetic field generated by the write current I1 while maintaining the anti-ferromagnetic coupling state between the upper ferromagnetic layer 113c and the lower ferromagnetic layer 113a. Consequently, the composed magnetization (composed magnetic moment) in the recording layer 113 of the first MTJ element 100 is directed in the 90° direction.

(Fourth Cycle)

In the fourth cycle, as indicated by (e) in FIG. 7, both the first write wiring W1 and second write wiring W2 are turned off to stop supplying the write currents I1 and I2 to them. Hence, in the fourth cycle, the applied magnetic fields disappear.

In this case, the magnetizations of the upper ferromagnetic layer 213c and lower ferromagnetic layer 213a of the second MTJ element 200 return to the stable state in the 135° and 315° directions (direction of the axis e2 of easy magnetization). More specifically, the magnetizations of the upper ferromagnetic layer 213c and lower ferromagnetic layer 213a further rotate clockwise. The magnetization of the upper ferromagnetic layer 213c is directed in the 315° direction. The magnetization of the lower ferromagnetic layer 213a is directed in the 135° direction. The magnetization in the recording layer 213 of the second MTJ element 200 is directed in the direction rotated 180° from the initial state. Hence, the data of the second MTJ element 200 can be rewritten from "1" to "0".

The magnetizations of the upper ferromagnetic layer 113c and lower ferromagnetic layer 113a of the first MTJ element 100 return to the stable state in the 45° and 225° directions (direction of the axis e2 of easy magnetization). More specifically, the magnetizations of the upper ferromagnetic layer 113c and lower ferromagnetic layer 113a rotate counterclockwise. The magnetization of the upper ferromagnetic layer 113c is directed in the 45° direction. The magnetization of the lower ferromagnetic layer 113a is directed in the 225° direction. The magnetization in the recording layer 113 of the first MTJ element 100 is directed in the same direction as in the initial state. The data of the first MTJ element 100 remains "1" and is not rewritten.

(c) Write Method Example 3 of Second MTJ Element

In Write Method Example 3 of the second MTJ element, the write current supply direction is adjusted such that the application direction of the synthetic field by the write currents in the second cycle matches the direction of the axis e2 of easy magnetization of the second MTJ element 200, i.e., "315° direction". Data is rewritten while rotating the magnetization of the recording layer 213 "counterclockwise".

Figure 8:
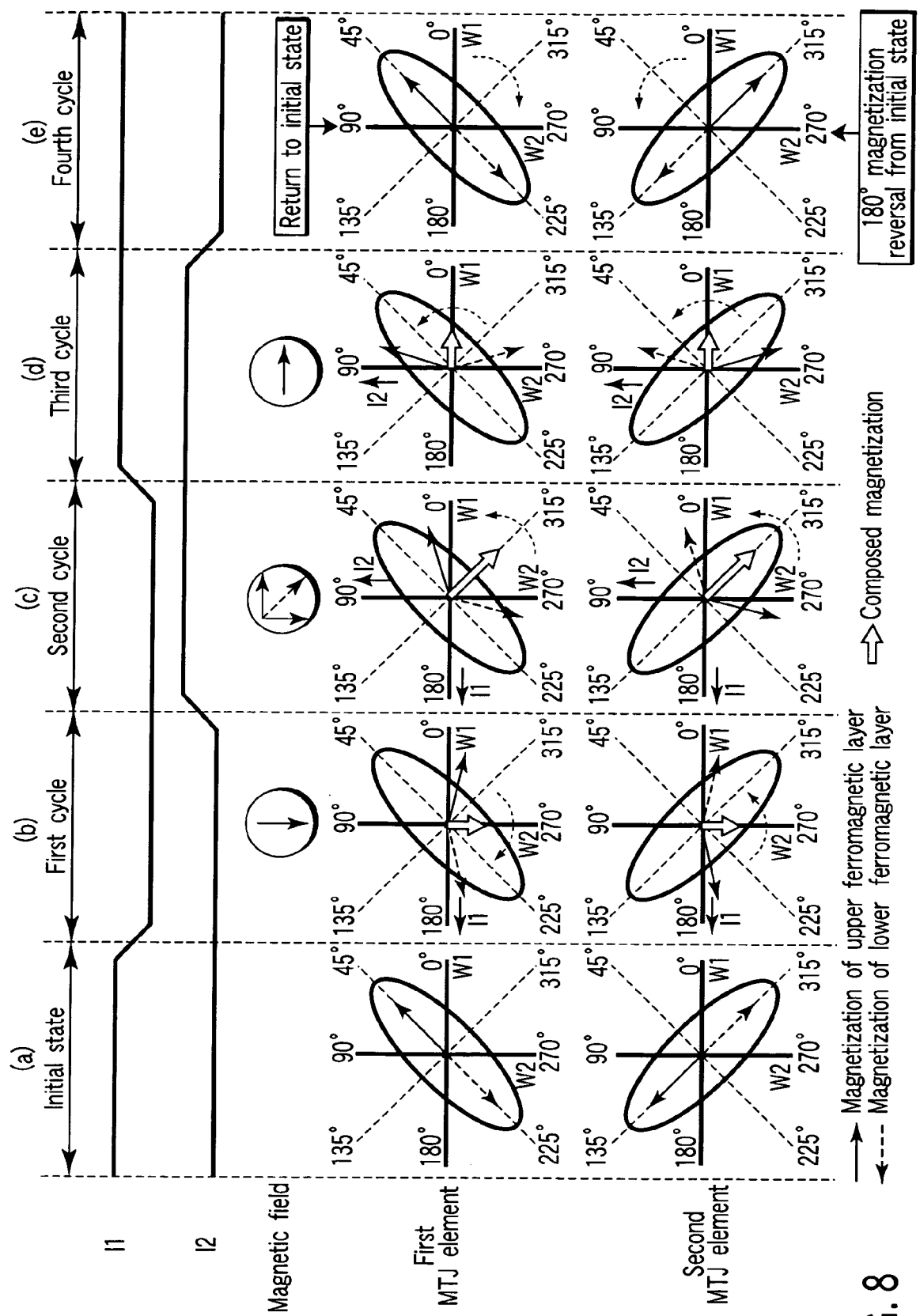
FIG. 8 is an explanatory view of the cycles of Write Method Example 3 of the second MTJ element according to the first embodiment of the present invention.

FIG. 8 is an explanatory view of the cycles of Write Method Example 3 of the second MTJ element according to the first embodiment of the present invention. Write Method Example 3 of the second MTJ element will be described below.

(Initial State)

In the initial state, as indicated by (a) in FIG. 8, both the first and second write wirings W2 are off and set in the no energized state in which neither write current I1 nor I2 flows to them.

In this case, as in (a) in FIG. 2, the magnetizations of the upper ferromagnetic layer 113c and lower ferromagnetic layer 113a of the first MTJ element 100 are directed in the 45° and 225° directions. The magnetizations of the upper ferromagnetic layer 213c and lower ferromagnetic layer 213a of the second MTJ element 200 are directed in the 135° and 315° directions.

(First Cycle)

In the first cycle, as indicated by (b) in FIG. 8, only the first write wiring W1 is turned on to supply the write current I1 in, e.g., the 180° direction. A magnetic field is generated in the 270° direction.

In this case, composed magnetization (composed magnetic moment) appears in the recording layer 213 of the second MTJ element 200 due to the magnetic field generated by the write current I1. The composed magnetization rotates counterclockwise until it is directed in the direction (270° direction) of the generated magnetic field while maintaining the anti-ferromagnetic coupling state between the upper ferromagnetic layer 213c and the lower ferromagnetic layer 213a.

Composed magnetization (composed magnetic moment) appears in the recording layer 113 of the first MTJ element 100 due to the magnetic field generated by the write current I1. The composed magnetization rotates clockwise until it is directed in the direction (270° direction) of the generated magnetic field while maintaining the anti-ferromagnetic coupling state between the upper ferromagnetic layer 113c and the lower ferromagnetic layer 113a.

(Second Cycle)

In the second cycle, as indicated by (c) in FIG. 8, the first write wiring W1 is kept on to continuously supply the write current I1 in the 180° direction. The second write wiring W2 is also turned on to start supplying the write current I2 in the 90° direction. A synthetic magnetic field is generated in the 315° direction.

In this case, composed magnetization (composed magnetic moment) in the recording layer 213 of the second MTJ element 200 further rotates counterclockwise until it is directed in the direction (315° direction) of the synthetic field generated by the write currents I1 and I2 while maintaining the anti-ferromagnetic coupling state between the upper ferromagnetic layer 213c and the lower ferromagnetic layer 213a. Consequently, the composed magnetization (composed magnetic moment) in the recording layer 213 of the second MTJ element 200 is directed in the 315° direction.

Composed magnetization (composed magnetic moment) in the recording layer 113 of the first MTJ element 100 rotates counterclockwise this time until it is directed in the direction (315° direction) of the synthetic field generated by the write currents I1 and I2 while maintaining the anti-ferromagnetic coupling state between the upper ferromagnetic layer 113c and the lower ferromagnetic layer 113a. Consequently, the composed magnetization (composed magnetic moment) in the recording layer 113 of the first MTJ element 100 is directed in the 315° direction.

(Third Cycle)

In the third cycle, as indicated by (d) in FIG. 8, the first write wiring W1 is turned off to stop supplying the write current I1. Only the second write wiring W2 is kept on to continuously supply the write current I2 in the 90° direction. A magnetic field is generated in the 0° direction.

In this case, composed magnetization (composed magnetic moment) in the recording layer 213 of the second MTJ element 200 further rotates counterclockwise until it is directed in the direction (0° direction) of the magnetic field generated by the write current I2 while maintaining the anti-ferromagnetic coupling state between the upper ferromagnetic layer 213c and the lower ferromagnetic layer 213a. Consequently, the composed magnetization (composed magnetic moment) in the recording layer 213 of the second MTJ element 200 is directed in the 0° direction.

Composed magnetization (composed magnetic moment) in the recording layer 113 of the first MTJ element 100 further rotates counterclockwise until it is directed in the direction (0° direction) of the magnetic field generated by the write current I2 while maintaining the anti-ferromagnetic coupling state between the upper ferromagnetic layer 113c and the lower ferromagnetic layer 113a. Consequently, the composed magnetization (composed magnetic moment) in the recording layer 113 of the first MTJ element 100 is directed in the 0° direction.

(Fourth Cycle)

In the fourth cycle, as indicated by (e) in FIG. 8, both the first write wiring W1 and second write wiring W2 are turned off to stop supplying the write currents I1 and I2 to them. Hence, in the fourth cycle, the applied magnetic fields disappear.

In this case, the magnetizations of the upper ferromagnetic layer 213c and lower ferromagnetic layer 213a of the second MTJ element 200 return to the stable state in the 135° and 315° directions (direction of the axis e2 of easy magnetization). More specifically, the magnetizations of the upper ferromagnetic layer 213c and lower ferromagnetic layer 213a rotate counterclockwise. The magnetization of the upper ferromagnetic layer 213c is directed in the 315° direction. The magnetization of the lower ferromagnetic layer 213a is directed in the 135° direction. The magnetization in the recording layer 213 of the second MTJ element 200 is directed in the direction rotated 180° from the initial state. Hence, the data of the second MTJ element 200 can be rewritten from "1" to "0".

The magnetizations of the upper ferromagnetic layer 113c and lower ferromagnetic layer 113a of the first MTJ element 100 return to the stable state in the 45° and 225° directions (direction of the axis e2 of easy magnetization). More specifically, the magnetizations of the upper ferromagnetic layer 113c and lower ferromagnetic layer 113a rotate clockwise. The magnetization of the upper ferromagnetic layer 113c is directed in the 45° direction. The magnetization of the lower ferromagnetic layer 113a is directed in the 225° direction. The magnetization in the recording layer 113 of the first MTJ element 100 is directed in the same direction as in the initial state. The data of the first MTJ element 100 remains "1" and is not rewritten.

(d) Write Method Example 4 of Second MTJ Element

In Write Method Example 4 of the second MTJ element, the write current supply direction is adjusted such that the application direction of the synthetic field by the write currents in the second cycle matches the direction of the axis e2 of easy magnetization of the second MTJ element 200, i.e., "135° direction". Data is rewritten while rotating the magnetization of the recording layer 213 "counterclockwise".

Figure 9:
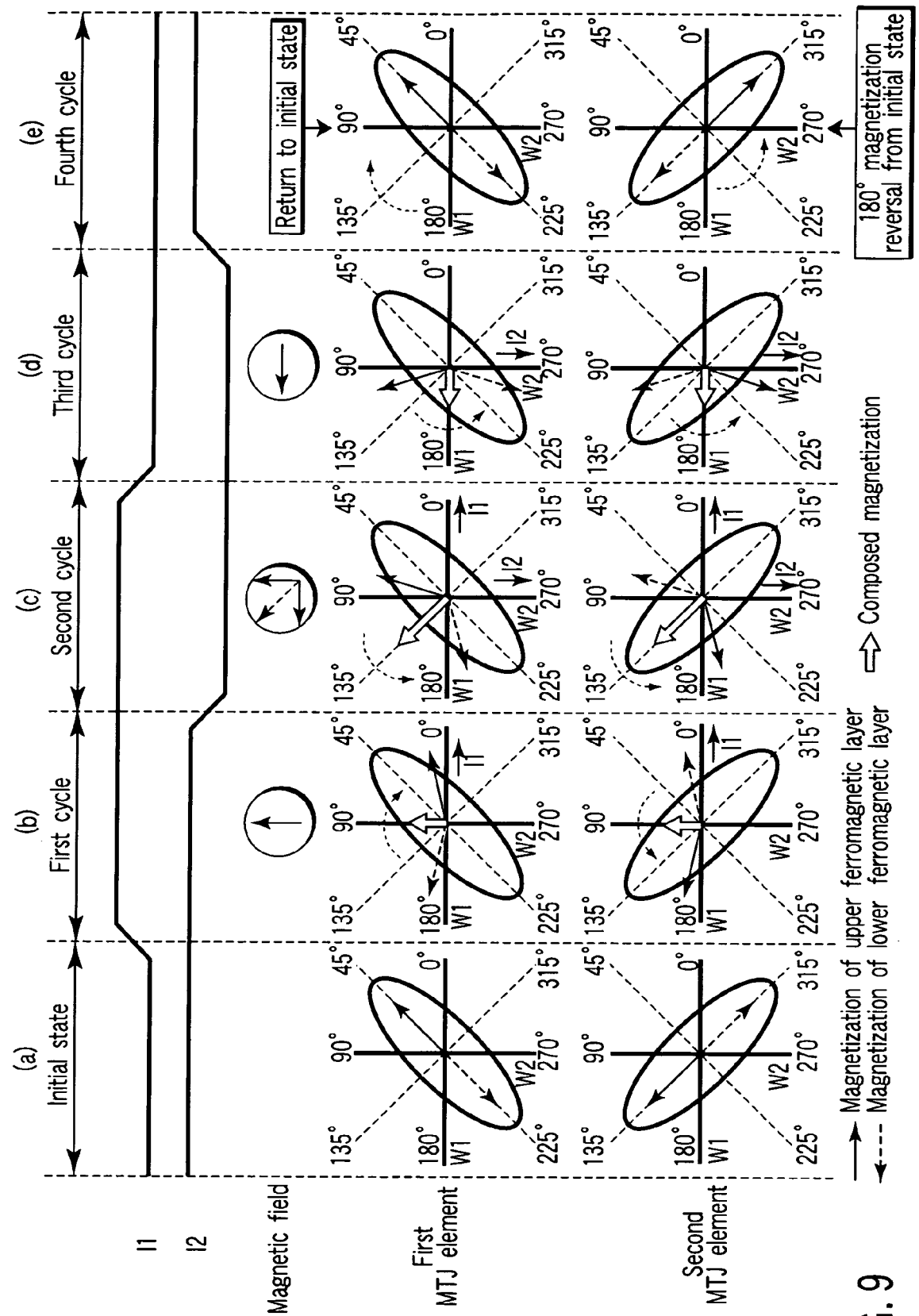
FIG. 9 is an explanatory view of the cycles of Write Method Example 4 of the second MTJ element according to the first embodiment of the present invention.

FIG. 9 is an explanatory view of the cycles of Write Method Example 4 of the second MTJ element according to the first embodiment of the present invention. Write Method Example 4 of the second MTJ element will be described below.

(Initial State)

In the initial state, as indicated by (a) in FIG. 9, both the first and second write wirings W2 are off and set in the no energized state in which neither write current I1 nor I2 flows to them.

In this case, as in (a) in FIG. 2, the magnetizations of the upper ferromagnetic layer 113c and lower ferromagnetic layer 113a of the first MTJ element 100 are directed in the 45° and 225° directions. The magnetizations of the upper ferromagnetic layer 213c and lower ferromagnetic layer 213a of the second MTJ element 200 are directed in the 135° and 315° directions.

(First Cycle)

In the first cycle, as indicated by (b) in FIG. 9, only the first write wiring W1 is turned on to supply the write current I1 in, e.g., the 0° direction. A magnetic field is generated in the 90° direction.

In this case, composed magnetization (composed magnetic moment) appears in the recording layer 213 of the second MTJ element 200 due to the magnetic field generated by the write current I1. The composed magnetization rotates counterclockwise until it is directed in the direction (90° direction) of the generated magnetic field while maintaining the anti-ferromagnetic coupling state between the upper ferromagnetic layer 213c and the lower ferromagnetic layer 213a.

Composed magnetization (composed magnetic moment) appears in the recording layer 113 of the first MTJ element 100 due to the magnetic field generated by the write current I1. The composed magnetization rotates clockwise until it is directed in the direction (90° direction) of the generated magnetic field while maintaining the anti-ferromagnetic coupling state between the upper ferromagnetic layer 113c and the lower ferromagnetic layer 113a.

(Second Cycle)

In the second cycle, as indicated by (c) in FIG. 9, the first write wiring W1 is kept on to continuously supply the write current I1 in the 0° direction. The second write wiring W2 is also turned on to start supplying the write current I2 in the 270° direction. A synthetic magnetic field is generated in the 135° direction.

In this case, composed magnetization (composed magnetic moment) in the recording layer 213 of the second MTJ element 200 further rotates counterclockwise until it is directed in the direction (135° direction) of the synthetic field generated by the write currents I1 and I2 while maintaining the anti-ferromagnetic coupling state between the upper ferromagnetic layer 213c and the lower ferromagnetic layer 213a. Consequently, the composed magnetization (composed magnetic moment) in the recording layer 213 of the second MTJ element 200 is directed in the 135° direction.

Composed magnetization (composed magnetic moment) in the recording layer 113 of the first MTJ element 100 rotates counterclockwise this time until it is directed in the direction (135° direction) of the synthetic field generated by the write currents I1 and I2 while maintaining the anti-ferromagnetic coupling state between the upper ferromagnetic layer 113c and the lower ferromagnetic layer 113a. Consequently, the composed magnetization (composed magnetic moment) in the recording layer 113 of the first MTJ element 100 is directed in the 135° direction.

(Third Cycle)

In the third cycle, as indicated by (d) in FIG. 9, the first write wiring W1 is turned off to stop supplying the write current I1. Only the second write wiring W2 is kept on to continuously supply the write current I2 in the 270° direction. A magnetic field is generated in the 180° direction.

In this case, composed magnetization (composed magnetic moment) in the recording layer 213 of the second MTJ element 200 further rotates counterclockwise until it is directed in the direction (180° direction) of the magnetic field generated by the write current I2 while maintaining the anti-ferromagnetic coupling state between the upper ferromagnetic layer 213c and the lower ferromagnetic layer 213a. Consequently, the composed magnetization (composed magnetic moment) in the recording layer 213 of the second MTJ element 200 is directed in the 180° direction.

Composed magnetization (composed magnetic moment) in the recording layer 113 of the first MTJ element 100 further rotates counterclockwise until it is directed in the direction (180° direction) of the magnetic field generated by the write current I2 while maintaining the anti-ferromagnetic coupling state between the upper ferromagnetic layer 113c and the lower ferromagnetic layer 113a. Consequently, the composed magnetization (composed magnetic moment) in the recording layer 113 of the first MTJ element 100 is directed in the 180° direction.

(Fourth Cycle)

In the fourth cycle, as indicated by (e) in FIG. 9, both the first write wiring W1 and second write wiring W2 are turned off to stop supplying the write currents I1 and I2 to them. Hence, in the fourth cycle, the applied magnetic fields disappear.

In this case, the magnetizations of the upper ferromagnetic layer 213c and lower ferromagnetic layer 213a of the second MTJ element 200 return to the stable state in the 135° and 315° directions (direction of the axis e2 of easy magnetization). More specifically, the magnetizations of the upper ferromagnetic layer 213c and lower ferromagnetic layer 213a rotate counterclockwise. The magnetization of the upper ferromagnetic layer 213c is directed in the 315° direction. The magnetization of the lower ferromagnetic layer 213a is directed in the 135° direction. The magnetization in the recording layer 213 of the second MTJ element 200 is directed in the direction rotated 180° from the initial state. Hence, the data of the second MTJ element 200 can be rewritten from "1" to "0".

The magnetizations of the upper ferromagnetic layer 113c and lower ferromagnetic layer 113a of the first MTJ element 100 return to the stable state in the 45° and 225° directions (direction of the axis e2 of easy magnetization). More specifically, the magnetizations of the upper ferromagnetic layer 113c and lower ferromagnetic layer 113a rotate clockwise. The magnetization of the upper ferromagnetic layer 113c is directed in the 45° direction. The magnetization of the lower ferromagnetic layer 113a is directed in the 225° direction. The magnetization in the recording layer 113 of the first MTJ element 100 is directed in the same direction as in the initial state. The data of the first MTJ element 100 remains "1" and is not rewritten.

[1-3] Read Method

As the read method of the magnetic random access memory according to the first embodiment of the present invention, a normal read method is employed. A voltage (or current) is applied between the upper electrode 20 and the lower electrode 30, and a current (or voltage) is detected by the sense amplifier 41, thereby discriminating the "1" and "0" states of the first and second MTJ elements 100 and 200.

When the relative magnetization direction between the recording layer (ferromagnetic layer on the side facing the fixed layer) and the fixed layer (ferromagnetic layer on the side facing the recording layer when the fixed layer includes a plurality of ferromagnetic layers divided by nonmagnetic layers) of the MTJ element is in the parallel state (e.g., "1" state), the resistance is low. In the anti-parallel state (e.g., "0" state), the resistance is high. The "1" or "0" state of the MTJ element is determined by reading the difference in resistance value.

In this embodiment, the two MTJ elements 100 and 200 are connected in series in one cell. When a voltage (or current) is applied between the upper electrode 20 and the lower electrode 30, and a current (or voltage) is read out, the sum of the resistance values of the two MTJ elements 100 and 200 is read out. In this embodiment, the total resistance value of one cell is read out, thereby determining the data of each of the MTJ elements 100 and 200. The read method will be described below in detail.

Figure 10:
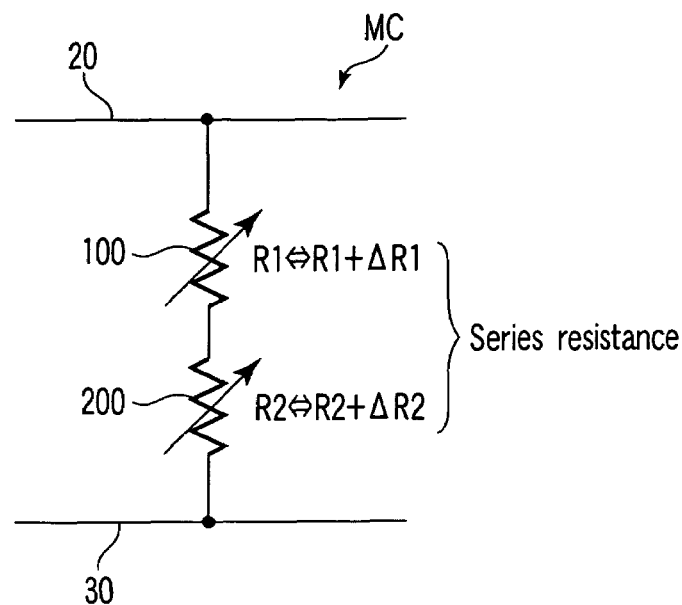
FIG. 10 is a schematic circuit diagram showing the MTJ element of one cell according to the first embodiment of the present invention.
Figure 11:
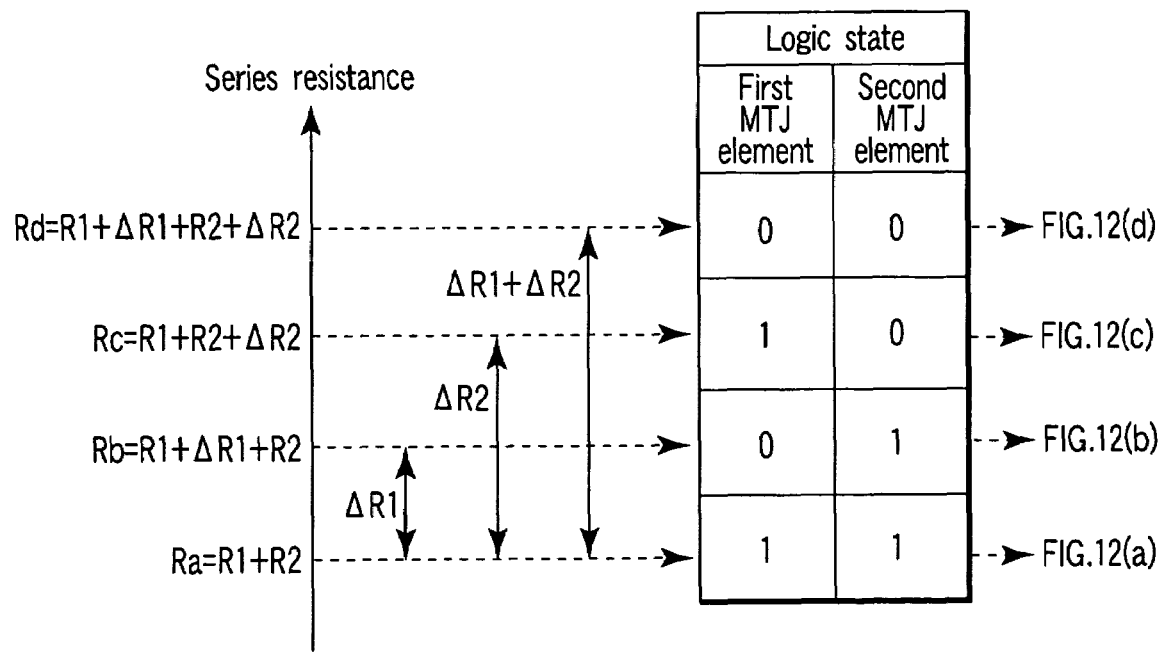
FIG. 11 is a view for explaining the difference in series resistance between logic states in the read according to the first embodiment of the present invention.

FIG. 10 is a schematic circuit diagram of the MTJ element of one cell according to the first embodiment of the present invention. FIG. 11 is a view for explaining the difference in series resistance between logic states in the read according to the first embodiment of the present invention. FIGS. 12A to 12D are views for explaining the magnetization arrangements of logic states according to the first embodiment of the present invention.

As shown in FIG. 10, in a memory cell MC according to the first embodiment, the first MTJ element 100 and second MTJ element 200 are connected in series. The resistance values of the first and second MTJ elements 100 and 200 change between the "1" state and the "0" state. In the first MTJ element 100, the resistance value in the "1" state is represented by R1, and the resistance value in the "0" state is represented by R1+ΔR1. In the second MTJ element 200, the resistance value in the "1" state is represented by R2, and the resistance value in the "0" state is represented by R2+ΔR2. A series resistance R of the memory cell MC equals the sum of the resistance (R1 or R1+ΔR1) of the first MTJ element 100 and the resistance (R2 or R2+ΔR2) of the second MTJ element 200.

As shown in FIG. 11, the series resistance R of the first and second MTJ elements 100 and 200 changes to four values Ra, Rb, Rc, and Rd depending on the logic states of the first and second MTJ elements 100 and 200.

Figure 12A:
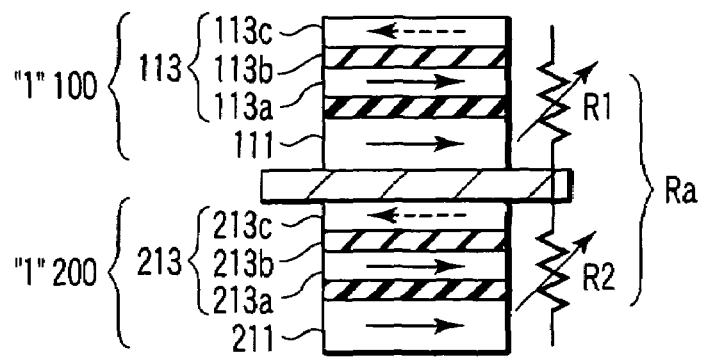
FIGS. 12A, 12B, 12C and 12D are views for explaining the magnetization arrangements of logic states according to the first embodiment of the present invention.

For example, assume that "1" data is written in both of the first and second MTJ elements 100 and 200 (FIG. 12A). The resistance value of the first MTJ element 100 is R1. The resistance value of the second MTJ element 200 is R2. The series resistance Ra of the memory cell MC is R1+R2.

Figure 12B:
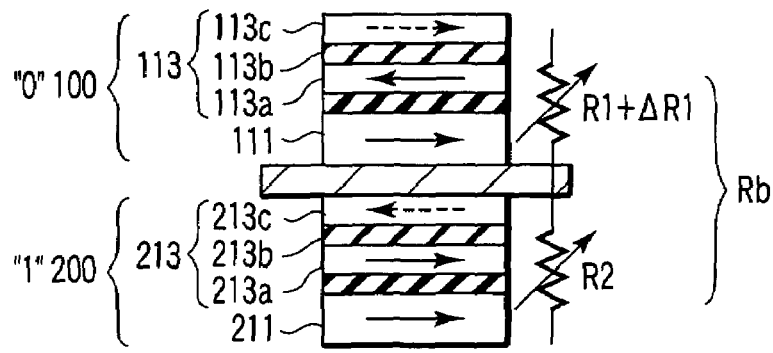

For example, assume that "0" data is written in the first MTJ element 100, and "1" data is written in the second MTJ element 200 (FIG. 12B). The resistance value of the first MTJ element 100 is R1+ΔR1. The resistance value of the second MTJ element 200 is R2. The series resistance Rb of the memory cell MC is R1+ΔR1+R2.

Figure 12C:
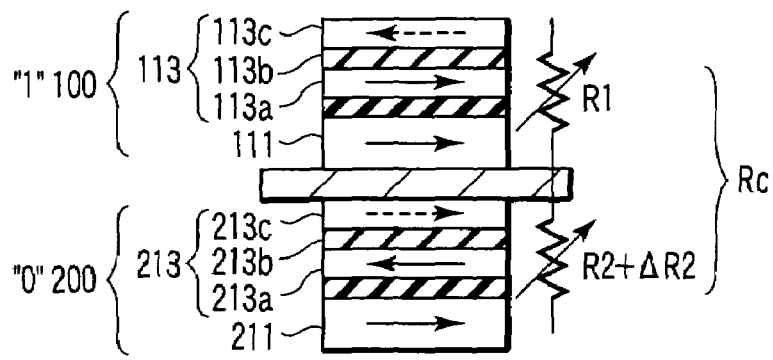

For example, assume that "1" data is written in the first MTJ element 100, and "0" data is written in the second MTJ element 200 (FIG. 12C). The resistance value of the first MTJ element 100 is R1. The resistance value of the second MTJ element 200 is R2+ΔR2. The series resistance Rc of the memory cell MC is R1+R2+ΔR2.

Figure 12D:
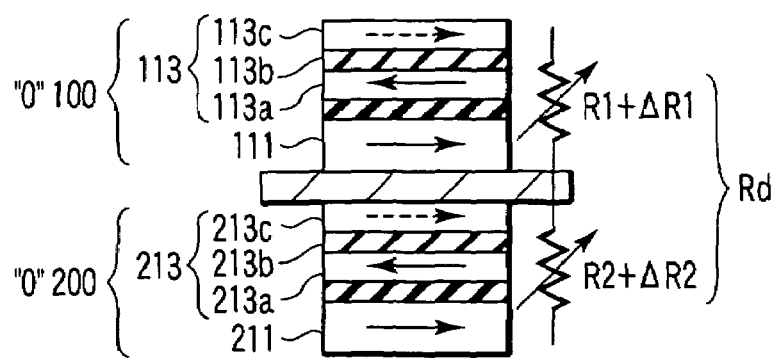

For example, assume that "0" data is written in both of the first and second MTJ elements 100 and 200 (FIG. 12D). The resistance value of the first MTJ element 100 is R1+ΔR1. The resistance value of the second MTJ element 200 is R2+ΔR2. The series resistance Rd of the memory cell MC is R1+ΔR1+R2+ΔR2.

Quaternary data can be read out on the basis of the difference between the resistance values Ra, Rb, Rc, and Rd in the four states. More specifically, when the series resistance R of the memory cell MC in the read is, e.g., Ra, "1" data is written in both of the first and second MTJ elements 100 and 200. When the series resistance R is, e.g., Rb, "0" data is written in the first MTJ element 100, and "1" data is written in the second MTJ element 200. When the series resistance R is, e.g., Rc, "1" data is written in the first MTJ element 100, and "0" data is written in the second MTJ element 200. When the series resistance R is, e.g., Rd, "0" data is written in both of the first and second MTJ elements 100 and 200.

To make the quaternary read possible, the four different resistance values Ra, Rb, Rc, and Rd must be generated. More specifically, to obtain the different resistance values Rb and Rc, the resistance change amounts ΔR1 and ΔR2 must be different.

To satisfy this condition, the first and second MTJ elements 100 and 200 are defined as follows.

For example, the tunnel barrier layer 112 of the first MTJ element 100 and the tunnel barrier layer 212 of the second MTJ element 200 are formed in different thicknesses.

Alternatively, different magnetoresistive (MR) ratios may be obtained by forming the first MTJ element 100 and second MTJ element 200 from different materials. For example, when $Co_9$—Fe (antiferromagnetic layers are made of, e.g., Pt—Mn) is used for the fixed layers 111 and 211, the MR ratio can be changed by using following materials for the recording layers 113 and 213. When the material of the recording layers 113 an 213 is Co—Fe, the MR ratio is 50% or less. When the material of the recording layers 113 an 213 is Co—Fe—Ni, the MR ratio is 40% to 45%. When the material of the recording layers 113 an 213 is Ni—Fe, the MR ratio is 35% or less.

Alternatively, the first MTJ element 100 and second MTJ element 200 may be formed in different sizes.

As described above, when the four different resistance values Ra, Rb, Rc, and Rd are generated, quaternary states can be obtained. When the resistance values Rb and Rc of the first and second MTJ elements 100 and 200 almost equal, ternary states can be obtained.

[1-4] Manufacturing Method

A method of manufacturing the magnetic random access memory according to the first embodiment of the present invention will briefly be described with reference to FIG. 1.

The second write wiring W2 is formed. An interlayer is formed on the second write wiring W2. The lower electrode 30 is formed on the interlayer. A material layer 200a of the second MTJ element 200 is formed on the lower electrode 30. The second MTJ element 200 is formed by processing the material layer 200a. The intermediate electrode 10 is formed on the second MTJ element 200. A material layer 100a of the first MTJ element 100 is formed on the intermediate electrode 10. The first MTJ element 100 is formed by processing the material layer 100a. The upper electrode 20 is formed on the first MTJ element 100. The first write wiring W1 is formed above the upper electrode 20.

The directions of the axes e1 and e2 of easy magnetization of the first and second MTJ elements 100 and 200 are determined by magnetic annealing and shape magnetic anisotropy in forming the fixed layers 111 and 211. For this reason, the MTJ elements can have stronger anisotropy and stable magnetic characteristic. In addition, a large output signal can be ensured. Since the intermediate electrode 10 is provided, the second MTJ element 200 is not affected by the process of the first MTJ element 100.

[1-5] Material

The layers of the memory cell according to this embodiment are formed from, e.g., the following materials.

The following ferromagnetic materials are used for the fixed layers 111 and 211 and recording layers 113 and 213. For example, Fe, Co, Ni, a layered film thereof, an alloy thereof, magnetite having a high spin polarizability, an oxide such as $CrO_2$ or $RXMnO_{3-Y}$ (R: rare earth, X: Ca, Ba, or Sr), or a Heusler alloy such as NiMnSb or PtMnSb is preferably used. The magnetic materials may contain a small amount of nonmagnetic element such as Ag, Cu, Au, Al, Mg, Si, Bi, Ta, B, C, O, N, Pd, Pt, Zr, Ir, W, Mo, or Nb as long as the ferromagnetism is not lost.

For the tunnel barrier layers 112 and 212, various dielectric materials such as $Al_2O_3$, $SiO_2$, MgO, AlN, $Bi_2O_3$, $MgF_2$, $CaF_2$, $SrTiO_2$, and $AlLaO_3$ can be used. These dielectric materials may contain oxygen, nitrogen, or fluorine defects.

For the intermediate electrode 10, a nonmagnetic material such as Ru, Ta, or TiN can be used.

According to the first embodiment, the first and second MTJ elements 100 and 200 are stacked between the pair of write wirings W1 and W2. The axes e1 and e2 of easy magnetization of the first and second MTJ elements 100 and 200 are made to cross perpendicularly and tilted 45° with respect to the running directions of the first and second write wirings W1 and W2. To write data in a selected one of the first and second MTJ elements 100 and 200, a current is supplied to the first selected wiring of the first and second write wirings W1 and W2 (first cycle)→a current is supplied to the second selected wiring of the first and second write wirings W1 and W2 (second cycle)→current supply to the first selected wiring is stopped (third cycle)→current supply to the second selected wiring is stopped (fourth cycle). The direction in which the current is supplied is adjusted such that the application direction of the synthetic field generated by the currents in the second cycle matches the direction of the axis e1 or e2 of easy magnetization of the selected element.

In the first to fourth cycles, magnetization in the recording layer of the selected element rotates in one direction (clockwise or counterclockwise). After the fourth cycle, the parallel magnetization arrangement changes to the anti-parallel magnetization arrangement, or the anti-parallel magnetization arrangement changes to the parallel magnetization arrangement. On the other hand, in the first to fourth cycles, magnetization in the recording layer of the unselected element rotates in two directions (clockwise and counterclockwise). After the fourth cycle, the magnetization arrangement returns to the original state. When the order and directions of the currents I1 and I2 supplied to the write wirings W1 and W2 are adjusted, data can selectively be written in the two MTJ elements 100 and 200. In addition, when the first and second MTJ elements 100 and 200 exhibit different resistance values for the same data, a quaternary read is possible.

As described above, according to the first embodiment, two-bit information can be stored between the pair of current magnetic field wirings. For this reason, multilevel storage in toggle cells is possible, and large-scale integration of the magnetic random access memory can be implemented.

[2] SECOND EMBODIMENT

The second embodiment is a modification to the first embodiment. The first and second MTJ elements and the intermediate electrode are processed at once so that they have the same planar shape. The write method and read method of the second embodiment are the same as those of the first embodiment, and a description thereof will be omitted.

[2-1] Structure

Figure 13A:
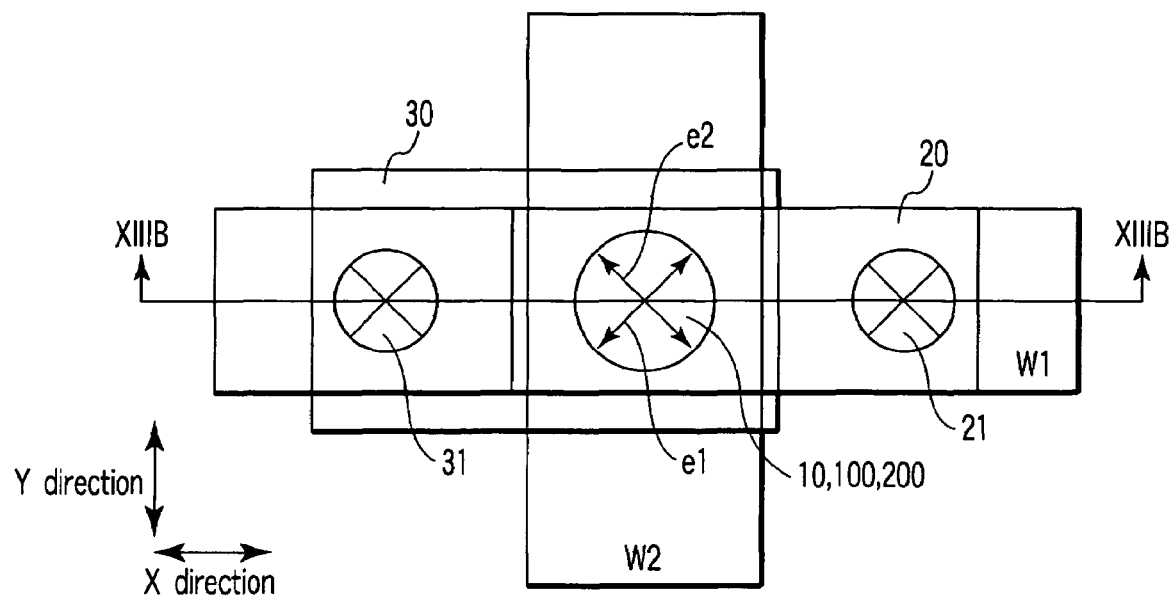
FIG. 13A is a plan view showing a magnetic random access memory according to the second embodiment of the present invention.
Figure 13B:
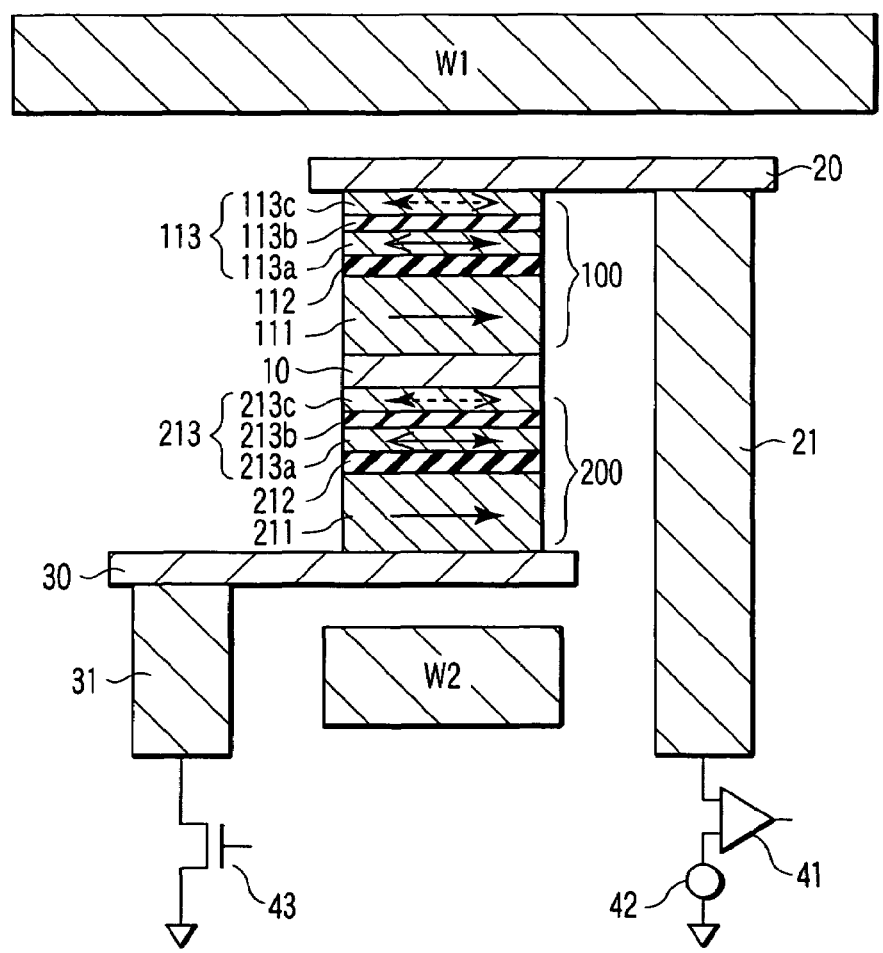
FIG. 13B is a sectional view of the magnetic random access memory taken along a line XIIIB-XIIIB in FIG. 13A.

FIG. 13A is a plan view of a magnetic random access memory according to the second embodiment of the present invention. FIG. 13B is a sectional view of the magnetic random access memory taken along a line XIIIB-XIIIB in FIG. 13A. The structure of the magnetic random access memory according to the second embodiment of the present invention will be described below.

As shown in FIGS. 13A and 13B, the second embodiment is different from the first embodiment in that first and second MTJ elements 100 and 200 and an intermediate electrode 10 have the same planar shape. The first and second MTJ elements 100 and 200 and intermediate electrode 10 have, e.g., a circular planar shape.

As in the first embodiment, the direction of an axis e1 of easy magnetization of the first MTJ element 100 tilts almost 45° with respect to the X or Y direction. The direction of an axis e2 of easy magnetization of the second MTJ element 200 tilts almost 45° with respect to the X or Y direction. The directions of the axes e1 and e2 of easy magnetization of the first and second MTJ elements 100 and 200 are different by almost 90°.

[2-2] Manufacturing Method

A method of manufacturing the magnetic random access memory according to the second embodiment of the present invention will briefly be described.

A second write wiring W2 is formed. An interlayer is formed on the second write wiring W2. A lower electrode 30 is formed on the interlayer. A material layer 200a of the second MTJ element 200, a material layer 10a of the intermediate electrode 10, and a material layer 100a of the first MTJ element 100 are sequentially formed on the lower electrode 30. The first and second MTJ elements 100 and 200 and intermediate electrode 10 having the same planar shape are formed by processing the material layers 100a, 10a, and 200a at once. After an upper electrode 20 is formed on the first MTJ element 100, a first write wiring W1 is formed above the upper electrode 20.

The directions of the axes e1 and e2 of easy magnetization of the first and second MTJ elements 100 and 200 are determined by making the MTJ elements 100 and 200 have different magnetic anisotropies at different magnetization temperatures.

According to the second embodiment, the same effect as in the first embodiment can be obtained. Additionally, in the second embodiment, the material layers 100a, 200a, and 10a of the first and second MTJ elements 100 and 200 and intermediate electrode 10 are formed at once, and magnetic annealing can be executed in two steps. For this reason, the effect of shortening the process and increasing the yield is large. Hence, the process cost can largely be reduced.

[3] THIRD EMBODIMENT

The third embodiment is a modification to the second embodiment. In the second embodiment, the fixed layer, tunnel barrier layer, and recording layer are formed in this order from the lower side (semiconductor substrate side) in both of the first and second MTJ elements 100 and 200. In the third embodiment, recording layers 113 and 213 of first and second MTJ elements 100 and 200 are formed close to each other. The write method and read method of the third embodiment are the same as those of the first embodiment, and a description thereof will be omitted.

[3-1] Structure

Figure 14A:
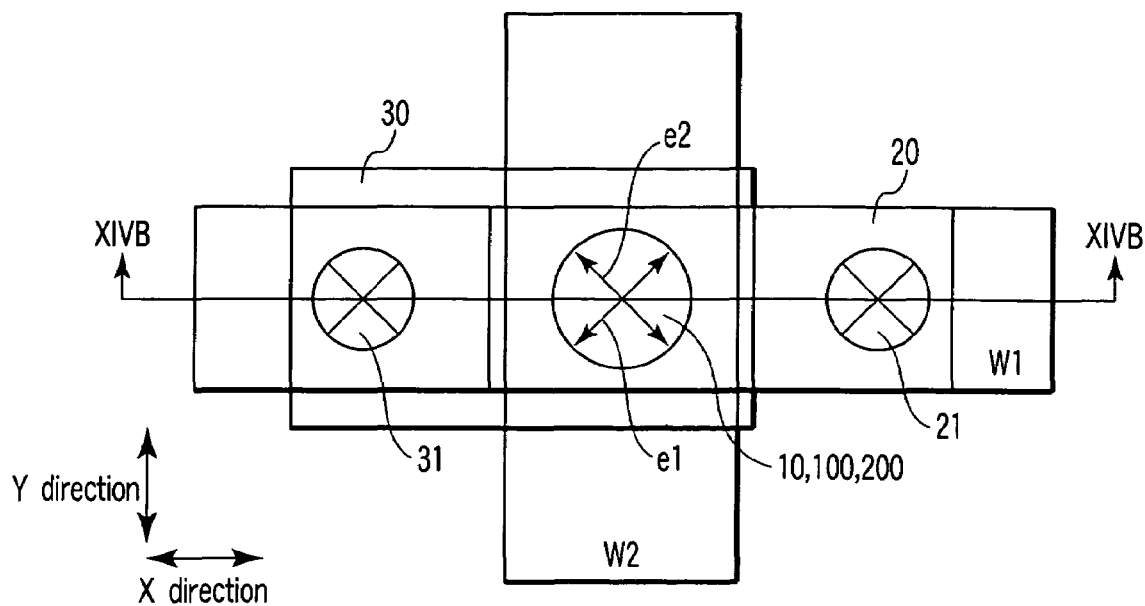
FIG. 14A is a plan view showing a magnetic random access memory according to the third embodiment of the present invention.
Figure 14B:
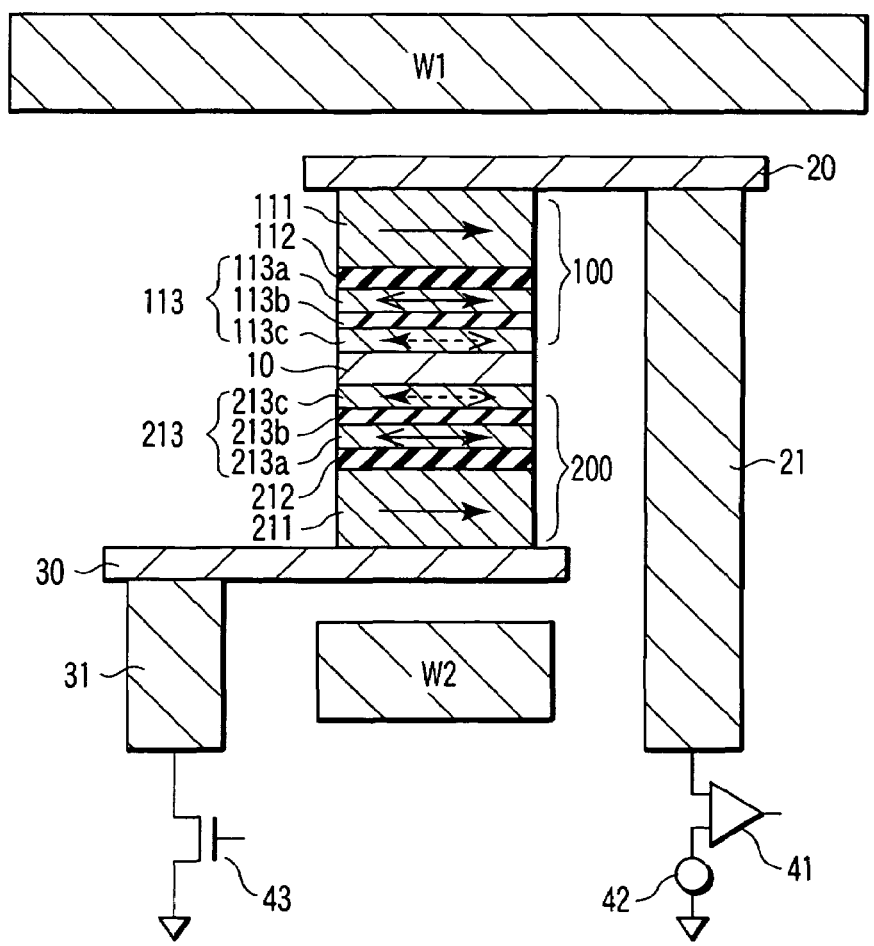
FIG. 14B is a sectional view of the magnetic random access memory taken along a line XIVB-XIVB in FIG. 14A.

FIG. 14A is a plan view of a magnetic random access memory according to the third embodiment of the present invention. FIG. 14B is a sectional view of the magnetic random access memory taken along a line XIVB-XIVB in FIG. 14A. The structure of the magnetic random access memory according to the third embodiment of the present invention will be described below.

As shown in FIGS. 14A and 14B, the third embodiment is different from the second embodiment in the order of forming the fixed layer, tunnel barrier layer, and recording layer in the first and second MTJ elements 100 and 200.

More specifically, in the first MTJ element 100, a fixed layer 111, tunnel barrier layer 112, and recording layer 113 are formed in this order downward from an upper electrode 20. To the contrary, in the second MTJ element 200, a fixed layer 211, tunnel barrier layer 212, and recording layer 213 are formed in this order upward from a lower electrode 30 (semiconductor substrate side). Hence, the recording layers 113 and 213 are close to each other. The recording layers 113 and 213 of the first and second MTJ elements 100 and 200 are in contact with an intermediate electrode 10. The fixed layer 111 of the first MTJ element 100 is in contact with the upper electrode 20. The fixed layer 211 of the second MTJ element 200 is in contact with the lower electrode 30.

[3-2] Manufacturing Method

A method of manufacturing the magnetic random access memory according to the third embodiment of the present invention will briefly be described.

A second write wiring W2 is formed. An interlayer is formed on the second write wiring W2. The lower electrode 30 is formed on the interlayer. A material layer 200a of the second MTJ element 200, a material layer 10a of the intermediate electrode 10, and a material layer 100a of the first MTJ element 100 are sequentially formed on the lower electrode 30. In the material layer 200a, the fixed layer 211, tunnel barrier layer 212, and recording layer 213 are formed in this order from the lower side. In the material layer 100a, the recording layer 113, tunnel barrier layer 112, and fixed layer 111 are formed in this order from the lower side. The first and second MTJ elements 100 and 200 and intermediate electrode 10 having the same planar shape are formed by processing the material layers 100a, 10a, and 200a at once. After the upper electrode 20 is formed on the first MTJ element 100, a first write wiring W1 is formed above the upper electrode 20.

The directions of axes e1 and e2 of easy magnetization of the first and second MTJ elements 100 and 200 are determined by making the MTJ elements 100 and 200 have different magnetic anisotropies at different magnetization temperatures.

According to the third embodiment, the same effect as in the second embodiment can be obtained. Additionally, in the third embodiment, the recording layers 113 and 213 of the first and second MTJ elements 100 and 200 are close to each other. In the second embodiment, the recording layer 213 is sandwiched between two fixed layers 111 and 211. In the third embodiment, however, only one fixed layer is adjacent to each of the recording layers 113 and 213. Hence, in the third embodiment, the influence of morphology of the fixed layers 111 and 211 on the delicate recording layers 113 and 213 can be halved.

[4] FOURTH EMBODIMENT

The fourth embodiment is a modification to the first embodiment. First and second MTJ elements formed on separate substrates are stacked by a bonding technique. The write method and read method of the fourth embodiment are the same as those of the first embodiment, and a description thereof will be omitted.

[4-1] Structure

Figure 15A:
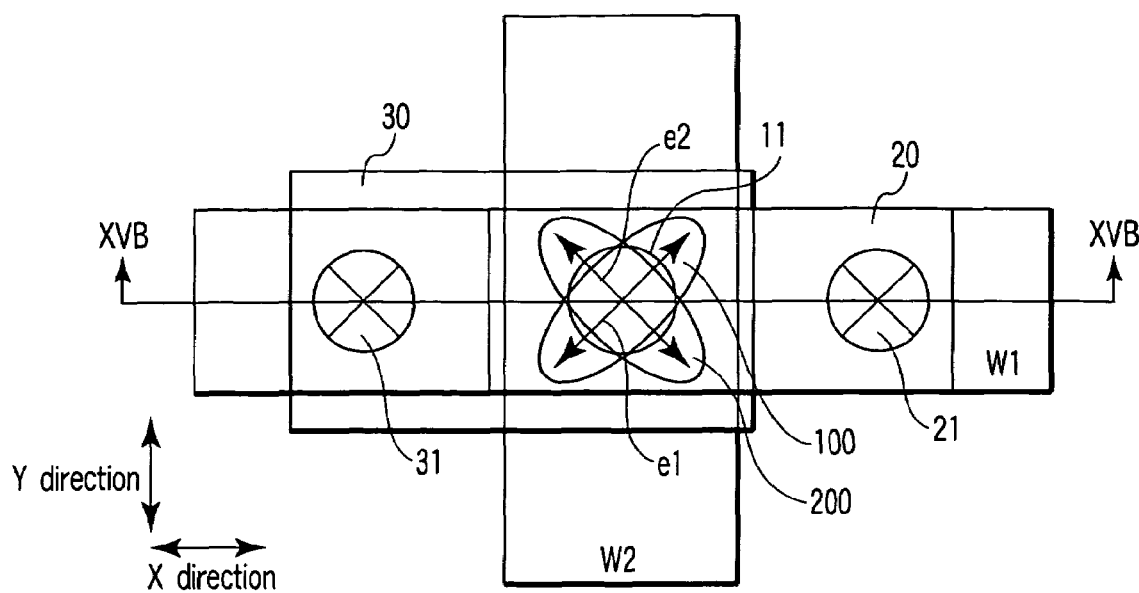
FIG. 15A is a plan view showing a magnetic random access memory according to the fourth embodiment of the present invention.
Figure 15B:
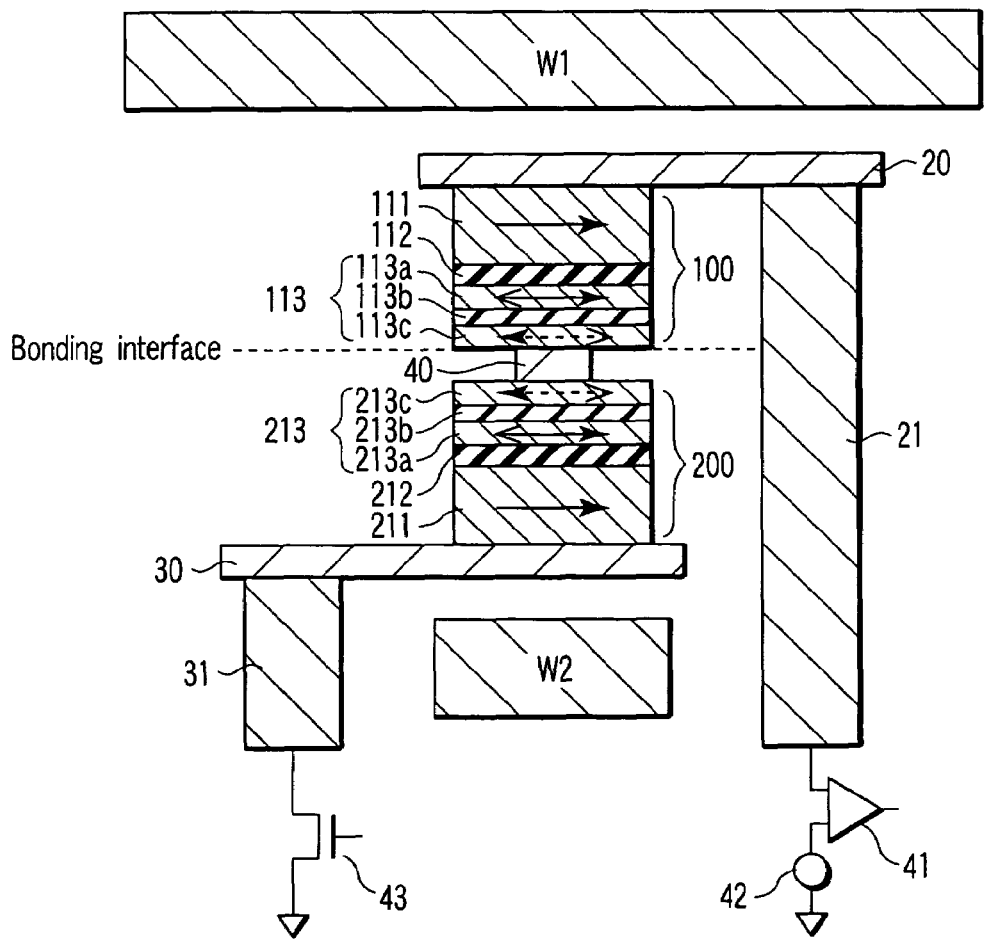
FIG. 15B is a sectional view of the magnetic random access memory taken along a line XVB-XVB in FIG. 15A.

FIG. 15A is a plan view of a magnetic random access memory according to the fourth embodiment of the present invention. FIG. 15B is a sectional view of the magnetic random access memory taken along a line XVB-XVB in FIG. 15A. The structure of the magnetic random access memory according to the fourth embodiment of the present invention will be described below.

As shown in FIGS. 15A and 15B, the fourth embodiment is different from the first embodiment in that first and second MTJ elements 100 and 200 are stacked by bonding. A contact 40 is provided between the first and second MTJ elements 100 and 200. The contact 40 is made of a nonmagnetic material (e.g., Ta, Ru, or TiN).

[4-2] Manufacturing Method

A method of manufacturing the magnetic random access memory according to the fourth embodiment of the present invention will briefly be described.

An interlayer dielectric film, switching element 43, contact 31, lower electrode 30, and write wiring W2 are formed on a second substrate. The second MTJ element 200 is formed and buried with an interlayer. The contact 40 connected to the second MTJ element 200 is buried in the interlayer.

On the other hand, an interlayer dielectric film, upper electrode 20, and write wiring W1 are formed on a first substrate different from the second substrate. The first MTJ element 100 is formed and buried with an interlayer. The interlayer is removed by polishing or etching to expose an end of the first MTJ element 100. The contact 40 connected to the first MTJ element 100 may be buried in the interlayer.

The first and second substrates are bonded. The first and second MTJ elements 100 and 200 are connected through the contact 40. Then, the unnecessary part of the first substrate is removed.

In the fourth embodiment, the directions of axes e1 and e2 of easy magnetization of the first and second MTJ elements 100 and 200 are determined by magnetic annealing and shape magnetic anisotropy, as in the first embodiment. For this reason, the MTJ elements can have stronger anisotropy and stable magnetic characteristic. In addition, a large output signal can be ensured.

According to the fourth embodiment, the same effect as in the first embodiment can be obtained. Additionally, in the fourth embodiment, the first and second MTJ elements 100 and 200 can separately be formed. Hence, the materials of the first and second MTJ elements 100 and 200 can have a wider choice of options. Process integration is easy. The magnetic characteristic can be stabilized, and process yield can be increased.

In the fourth embodiment, the first and second MTJ elements 100 and 200 are bonded such that recording layers 113 and 213 are arranged close. Instead, the first and second MTJ elements 100 and 200 may be bonded such that the fixed layer, tunnel barrier layer, and recording layer are stacked in this order from the lower side.

[5] FIFTH EMBODIMENT

The fifth embodiment is a modification to the first embodiment. Data of the first and second MTJ elements are read out separately. The write method of the fifth embodiment is the same as that of the first embodiment, and a description thereof will be omitted.

[5-1] Structure

Figure 16A:
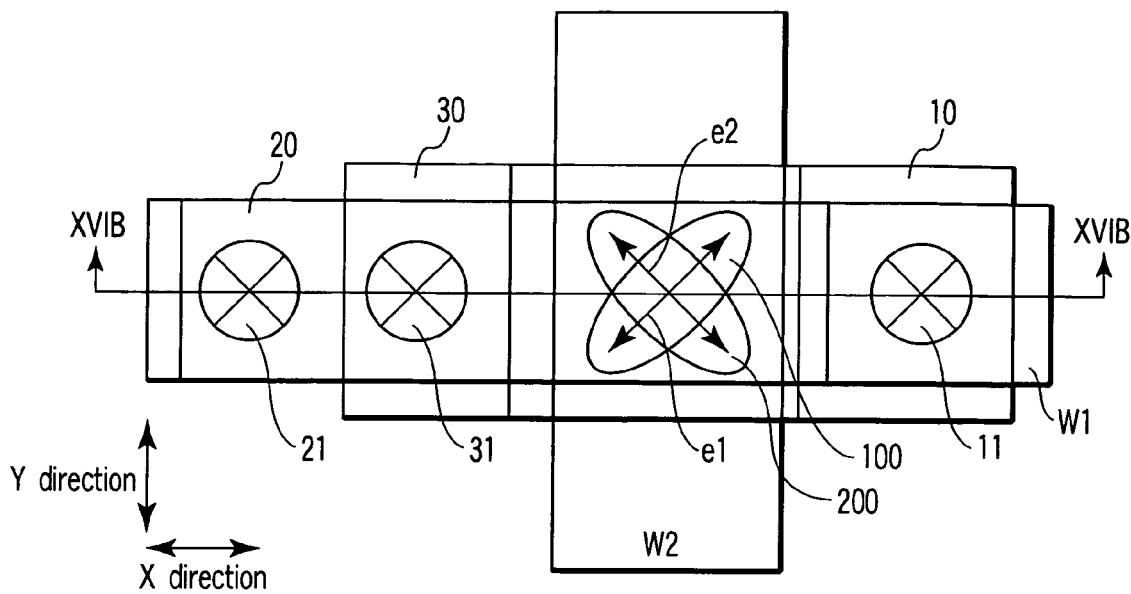
FIG. 16A is a plan view showing a magnetic random access memory according to the fifth embodiment of the present invention.
Figure 16B:
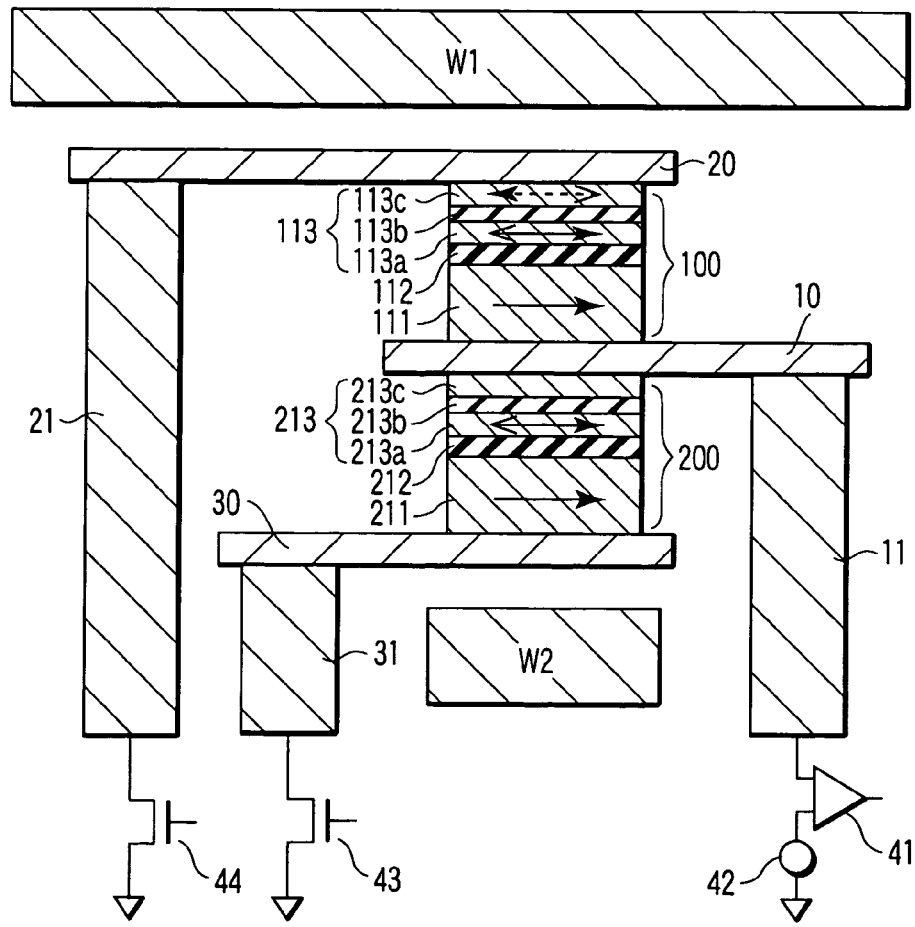
FIG. 16B is a sectional view of the magnetic random access memory taken along a line XVIB-XVIB in FIG. 16A.

FIG. 16A is a plan view of a magnetic random access memory according to the fifth embodiment of the present invention. FIG. 16B is a sectional view of the magnetic random access memory taken along a line XVIB-XVIB in FIG. 16A. The structure of the magnetic random access memory according to the fifth embodiment of the present invention will be described below.

As shown in FIGS. 16A and 16B, the fifth embodiment is different from the first embodiment in that a sense amplifier 41 is connected to an intermediate electrode 10, and a switching element (e.g., transistor) 44 is connected to an upper electrode 20. With this structure, each of a first MTJ element 100 and second MTJ element 200 can be selected in the data read.

[5-2] Read Method

In the first embodiment, a total series resistance R of the first and second MTJ elements 100 and 200 is read out, thereby reading out data of the two MTJ elements 100 and 200 simultaneously. In the read method of the fifth embodiment, a resistance R100 of the first MTJ element 100 and a resistance R200 of the second MTJ element 200 are read out separately.

For example, to read out data of the first MTJ element 100, the switching element 44 is turned on to supply a read current (or apply a voltage) between the upper electrode 20 and the sense amplifier 41. With this operation, the resistance R100 of only the first MTJ element 100 can be read out.

To read out data of the second MTJ element 200, a switching element 43 is turned on to supply a read current (or apply a voltage) between a lower electrode 30 and the sense amplifier 41. With this operation, the resistance R200 of only the second MTJ element 200 can be read out.

According to the fifth embodiment, the same effect as in the first embodiment can be obtained. Additionally, in the fifth embodiment, since the resistance value of the first MTJ element 100 and the resistance value of the second MTJ element 200 can be read out separately, the following effects can also be obtained.

Since the first and second MTJ elements 100 and 200 can have the same resistance value in the same write state, the selectivity of structures and materials of the first and second MTJ elements 100 and 200 can be increased. In addition, since the read signal amount is doubled, the operation margin can largely be increased.

[6] SIXTH EMBODIMENT

The sixth embodiment is a modification to the first embodiment. In the first embodiment, the write wirings (first and second write wirings W1 and W2) and read wirings (upper electrode 20 and lower electrode 30) are separately provided. In the sixth embodiment, part (first write wiring) of the write wirings is used as a read wiring. The write method of the sixth embodiment is the same as that of the first embodiment, and a description thereof will be omitted.

[6-1] Structure

Figure 17A:
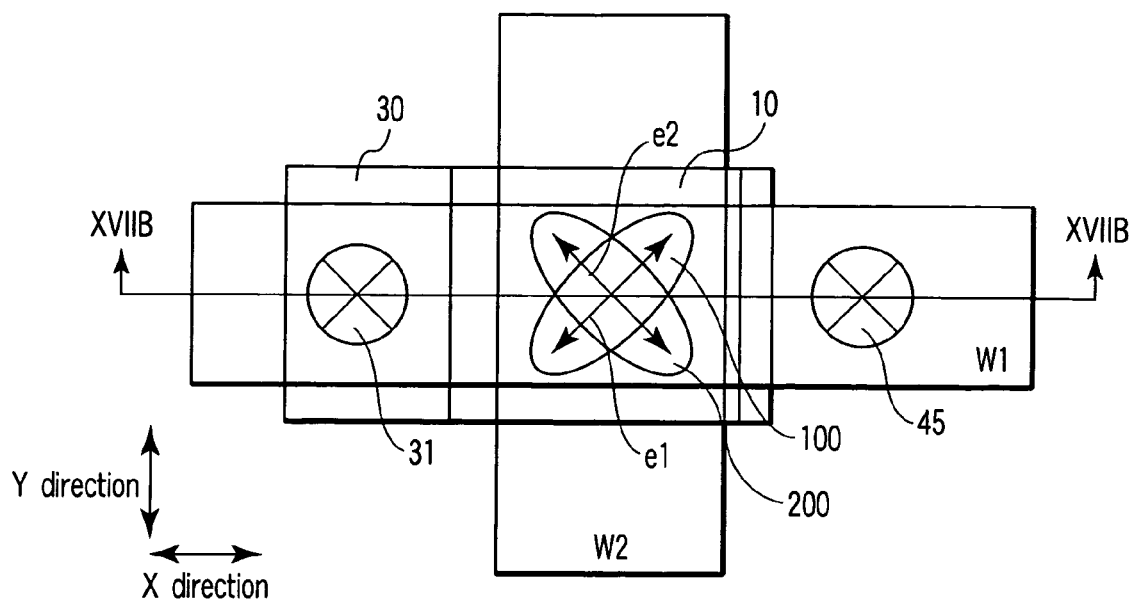
FIG. 17A is a plan view showing a magnetic random access memory according to the sixth embodiment of the present invention.
Figure 17B:
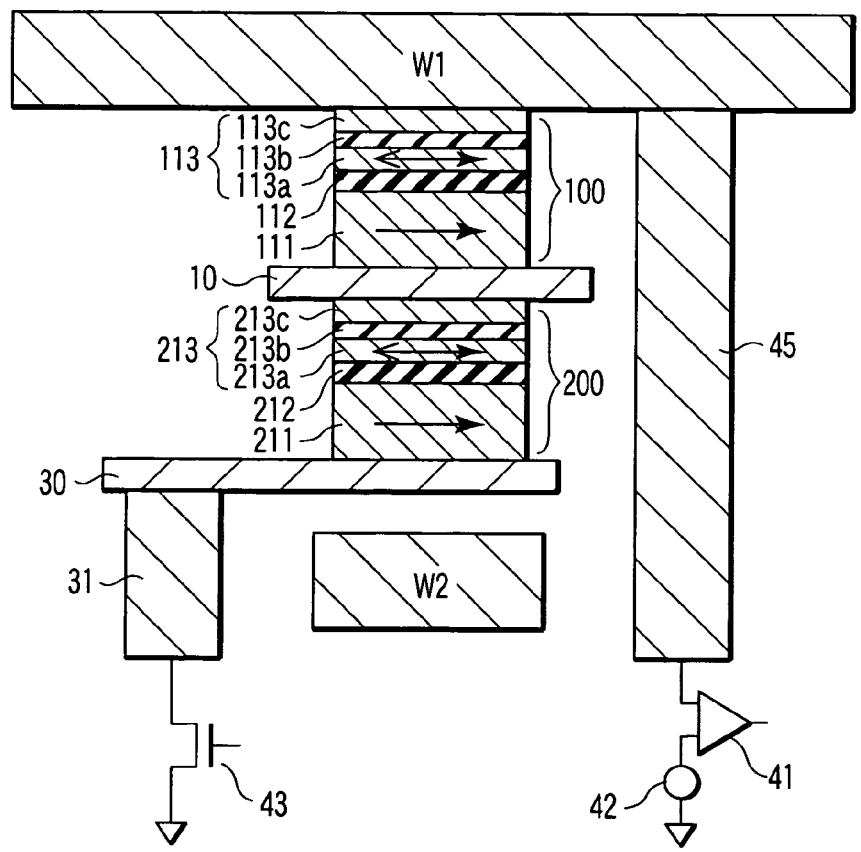
FIG. 17B is a sectional view of the magnetic random access memory taken along a line XVIIB-XVIIB in FIG. 17A.

FIG. 17A is a plan view of a magnetic random access memory according to the sixth embodiment of the present invention. FIG. 17B is a sectional view of the magnetic random access memory taken along a line XVIIB-XVIIB in FIG. 17A. The structure of the magnetic random access memory according to the sixth embodiment of the present invention will be described below.

As shown in FIGS. 17A and 17B, the sixth embodiment is different from the first embodiment in that the upper electrode is omitted, and a first write wiring W1 is connected directly to a first MTJ element 100. Hence, a sense amplifier 41 is electrically connected to the first write wiring W1 through a contact 45. The first MTJ element 100 may be connected to the first write wiring W1 through a contact.

[6-2] Read Method

In the read method of the first embodiment, a read current is supplied (or a voltage is applied) between the upper electrode 20 and the lower electrode 30. In the read method of the sixth embodiment, a read current is supplied (or a voltage is applied) between the first write wiring W1 and a lower electrode 30.

The method of discriminating data by reading out a total series resistance R of the first and second MTJ elements 100 and 200 is the same as in the first embodiment, and a description thereof will be omitted.

According to the sixth embodiment, the same effect as in the first embodiment can be obtained. Additionally, in the sixth embodiment, the cell area can be reduced by omitting the upper electrode.

[7] SEVENTH EMBODIMENT

The seventh embodiment is a modification to the sixth embodiment. Data of the first and second MTJ elements are read out separately. The write method of the seventh embodiment is the same as that of the first embodiment, and a description thereof will be omitted.

[7-1] Structure

Figure 18A:
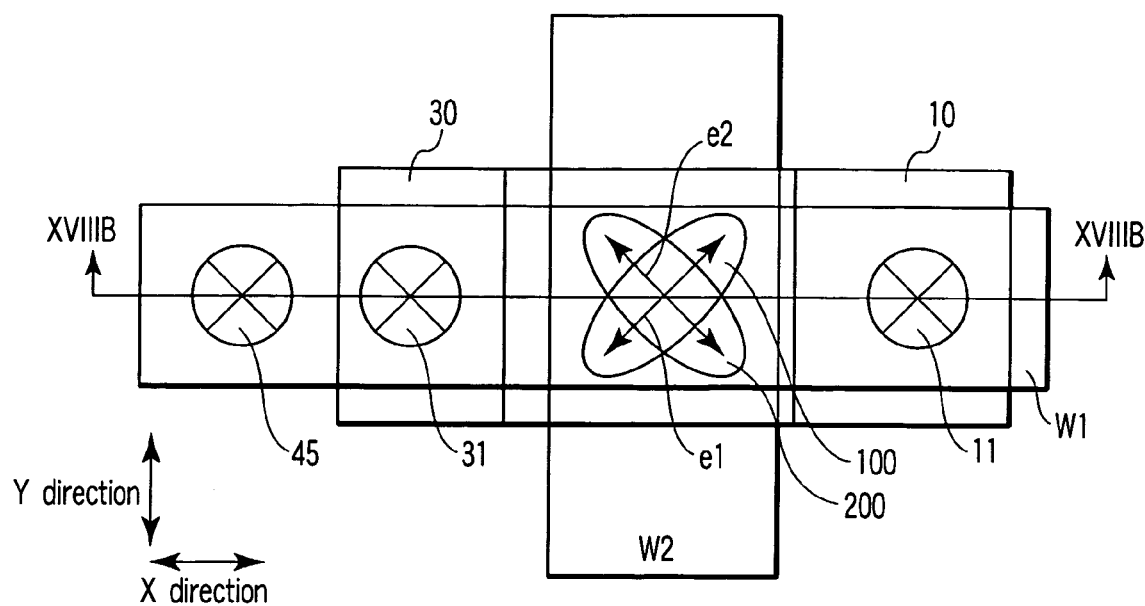
FIG. 18A is a plan view showing a magnetic random access memory according to the seventh embodiment of the present invention.
Figure 18B:
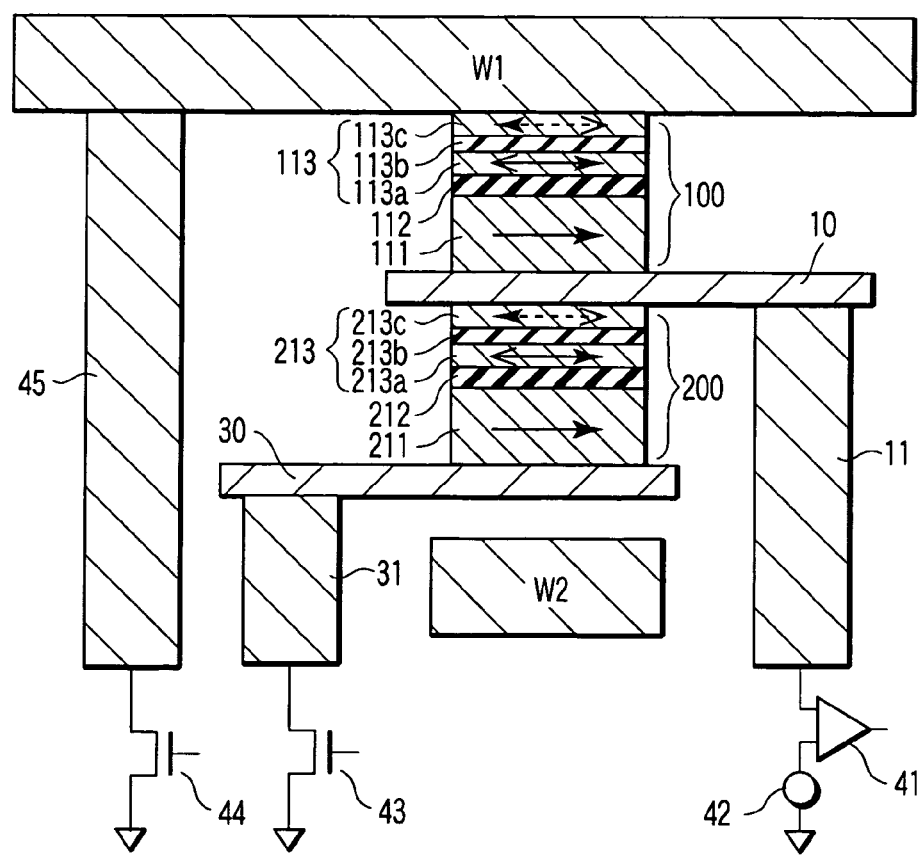
FIG. 18B is a sectional view of the magnetic random access memory taken along a line XVIIIB-XVIIIB in FIG. 18A.

FIG. 18A is a plan view of a magnetic random access memory according to the seventh embodiment of the present invention. FIG. 18B is a sectional view of the magnetic random access memory taken along a line XVIIIB-XVIIIB in FIG. 18A. The structure of the magnetic random access memory according to the seventh embodiment of the present invention will be described below.

As shown in FIGS. 18A and 18B, the seventh embodiment is different from the sixth embodiment in that a sense amplifier 41 is connected to an intermediate electrode 10, and a switching element (e.g., transistor) 44 is connected to a first write wiring W1. With this structure, each of a first MTJ element 100 and second MTJ element 200 can be selected in the data read.

[7-2] Read Method

In the sixth embodiment, a total series resistance R of the first and second MTJ elements 100 and 200 is read out, thereby reading out data of the two MTJ elements 100 and 200 simultaneously. In the read method of the seventh embodiment, a resistance R100 of the first MTJ element 100 and a resistance R200 of the second MTJ element 200 are read out separately.

For example, to read out data of the first MTJ element 100, the switching element 44 is turned on to supply a read current (or apply a voltage) between the first write wiring W1 and the sense amplifier 41. With this operation, the resistance R100 of only the first MTJ element 100 can be read out.

To read out data of the second MTJ element 200, a switching element 43 is turned on to supply a read current (or apply a voltage) between a lower electrode 30 and the sense amplifier 41. With this operation, the resistance R200 of only the second MTJ element 200 can be read out.

According to the seventh embodiment, the same effect as in the sixth embodiment can be obtained. Additionally, in the seventh embodiment, the resistance of the first MTJ element 100 and the resistance of the second MTJ element 200 can be read out separately. Since the first and second MTJ elements 100 and 200 can have the same resistance in the same write state, the selectivity of structures and materials of the first and second MTJ elements 100 and 200 can be increased.

[8] EIGHTH EMBODIMENT

In the above-described embodiments, the toggle write is executed for both of the first and second MTJ elements. In the eighth embodiment, the toggle write is executed for the first MTJ element, and the normal one-cycle write is executed for the second MTJ element. The read method of the eighth embodiment is the same as that of the above-described embodiments, and a description thereof will be omitted.

[8-1] Structure

Figures 19, 20:
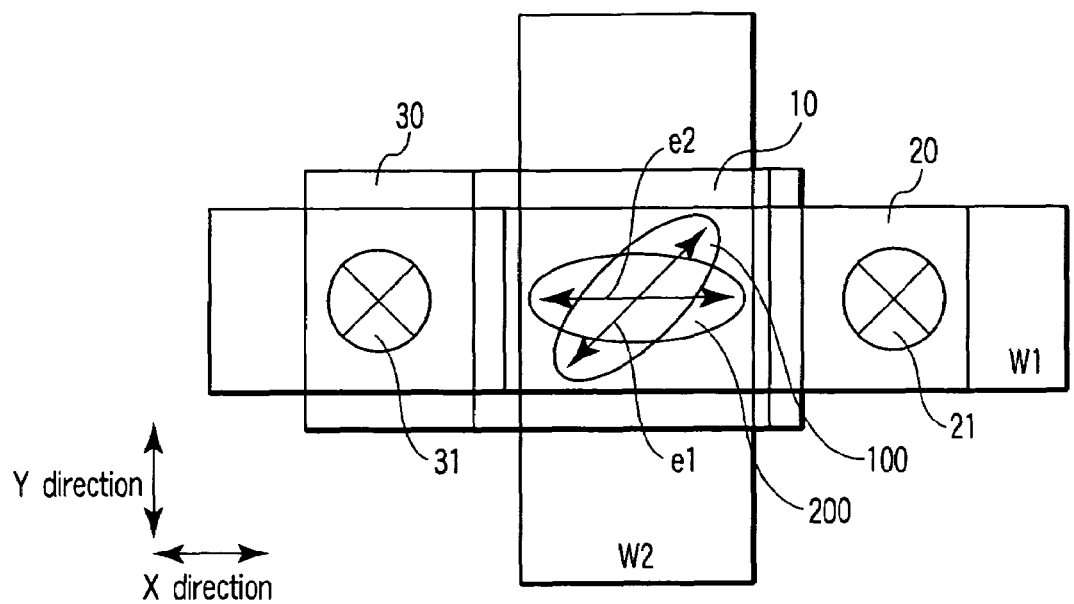
FIG. 19 is a plan view showing a magnetic random access memory according to the eighth embodiment of the present invention.
FIG. 20 is a view for explaining quaternary states by a write method according to the eighth embodiment of the present invention.

FIG. 19 is a plan view of a magnetic random access memory according to the eighth embodiment of the present invention. The structure of the magnetic random access memory according to the eighth embodiment of the present invention will be described below.

As shown in FIG. 19, the eighth embodiment is different from the first embodiment in that the direction of an axis e2 of easy magnetization of a second MTJ element 200 is the same as the running direction (X direction) of a first write wiring W1.

[8-2] Write Method

FIG. 20 is a view for explaining quaternary states by the write method according to the eighth embodiment of the present invention. The write method according to the eighth embodiment of the present invention will be described below with reference to FIG. 20.

In the first state, the write sequence in, e.g., FIG. 2 is executed. Magnetization e1 of a first MTJ element 100 is set in a 180° reverse state (e.g., "1" state). Magnetization e2 of the second MTJ element 200 is set in a right state (e.g., "1" state).

In the second state, the write sequence in, e.g., FIG. 3 is executed. The magnetization e1 of the first MTJ element 100 is set in the 180° reverse state (e.g., "1" state). The magnetization e2 of the second MTJ element 200 is set in a left state (e.g., "0" state).

In the third state, the write sequence in, e.g., FIG. 8 is executed. The magnetization e1 of the first MTJ element 100 is set in an unchanged state without magnetization reversal (e.g., "0" state). The magnetization e2 of the second MTJ element 200 is set in the right state (e.g., "1" state).

In the fourth state, the write sequence in, e.g., FIG. 9 is executed. The magnetization e1 of the first MTJ element 100 is set in the unchanged state without magnetization reversal (e.g., "0" state). The magnetization e2 of the second MTJ element 200 is set in the left state (e.g., "0" state).

As described above, according to the eighth embodiment, the first and second operations can selectively independently be executed by changing the order of starting supplying the current to the first and second write wirings W1 and W2 and the write current supply direction. The first operation is an operation of causing or not causing the first MTJ element 100 to execute the toggle operation. The second operation is an operation of reversing magnetization in a recording layer 213 of the second MTJ element 200. With this write operation, quaternary states can actually be generated.

According to the eighth embodiment, two-bit information can be stored between the pair of current magnetic field wirings, as in the first embodiment. For this reason, multi-level storage in toggle cells is possible, and large-scale integration of the magnetic random access memory can be implemented.

The present invention is not limited to the above-described embodiments, and various changes and modifications can be made in practicing the present invention without departing from its spirit and scope, as will be described below.

(a) In the MTJ elements 100 and 200 of the above-described embodiments, the recording layers 113 and 213 each have an anti-ferromagnetic coupling structure. The fixed layers 111 and 211 each have a single-layer structure. However, the present invention is not limited to this. For example, the fixed layers 111 and 211 each may have an anti-ferromagnetic coupling structure or ferromagnetic coupling structure. More specifically, the fixed layers 111 and 211 each may have a three-layer structure of first ferromagnetic layer/nonmagnetic layer/second ferromagnetic layer. They each may have an anti-ferromagnetic coupling structure in which magnetic coupling (interlayer exchange coupling) occurs such that the magnetization directions of the first and second ferromagnetic layers are anti-parallel. Alternatively, they each may have a ferromagnetic coupling structure in which magnetic coupling (interlayer exchange coupling) occurs such that the magnetization directions of the first and second ferromagnetic layers are parallel.

(b) The MTJ elements 100 and 200 of the above-described embodiments each have a single junction structure having one tunnel barrier layer. However, the present invention is not limited to this. For example, the MTJ elements 100 and 200 each may have a double junction structure having two tunnel barrier layers. More specifically, the MTJ elements 100 and 200 each having the double junction structure include a first fixed layer, a second fixed layer, a recording layer provided between the first and second fixed layers, a first tunnel barrier layer provided between the first fixed layer and the recording layer, and a second tunnel barrier layer provided between the second fixed layer and the recording layer.

(c) The planar shape of the MTJ elements 100 and 200 of the above-described embodiments is illustrated as an ellipse or circle. However, the present invention is not limited to this. For example, the planar shape of the MTJ elements 100 and 200 can variously be changed to a square, rectangle, hexagon, rhombus, parallelogram, cross, or bean-shape (concave shape).

In any planar shape, when the toggle write should be executed in the first and second MTJ elements 100 and 200, the directions of the axes e1 and e2 of easy magnetization are defined such that "the direction of the axis e1 of easy magnetization of the first MTJ element 100 tilts 45° with respect to the first or second write wiring W1 or W2, the direction of the axis e2 of easy magnetization of the second MTJ element 200 tilts 45° with respect to the first or second write wiring W1 or W2, and the directions of the axes e1 and e2 of easy magnetization of the first and second MTJ elements 100 and 200 are different by 90°".

(d) In the MTJ elements 100 and 200 of the above-described embodiments, the fixed layer, tunnel barrier layer, and recording layer are, e.g., processed at once and have the same planar shape. However, the present invention is not limited to this. For example, the fixed layer and tunnel barrier layer may be formed into a rectangular shape, and only the recording layer may be formed into a cross shape.

(e) In the magnetic random access memories of the above-described embodiments, transistors are illustrated as the switching elements 43 and 44. They may be, e.g., diodes. The switching elements 43 and 44 need not always be provided.

(f) In the magnetic random access memories of the above-described embodiments, the connection portions of the sense amplifier 41, reference cell 42, and switching element 43 can be changed if the resistance value of the MTJ element can be detected. For example, in the structure shown in FIG. 1, the sense amplifier 41 and reference cell 42 may be connected to the lower electrode 30, and the switching element 43 may be connected to the upper electrode 20. In the structure shown in FIG. 16, the sense amplifier 41 and reference cell 42 may be connected to the upper electrode 20 and lower electrode 30, respectively, and the switching element 43 may be connected to the intermediate electrode 10. In the structure shown in FIG. 17, the sense amplifier 41 and reference cell 42 may be connected to the lower electrode 30, and the switching element 43 may be connected to the first write wiring W1. In the structure shown in FIG. 18, the sense amplifier 41 and reference cell 42 may be connected to the first write wiring W1 and lower electrode 30, respectively, and the switching element 43 may be connected to the intermediate electrode 10.

(g) Detailed examples of the method of fixing the magnetization directions of the fixed layers 111 and 211 of the first and second MTJ elements 100 and 200 in different directions are as follows.

The blocking temperature changes depending on the material of the anti-ferromagnetic layer used for the fixed layers 111 and 211. For example, the blocking temperature is 430° C. when the material of the anti-ferromagnetic layer is Ni—Mn, 350° C. when the material is Pt—Mn, 260° C. when the material is Ir—Mn, and 150° C. when the material is Fe—Mn. By using the difference in blocking temperature, the magnetization directions of the fixed layers 111 and 211 of the first and second MTJ elements 100 and 200 are fixed in different directions.

First, the second MTJ element 200 is formed. More specifically, a first layered film including an anti-ferromagnetic layer (Pt—Mn)/fixed layer 211/tunnel barrier layer 212/recording layer 213 is deposited on the lower electrode 30. The first layered film is processed by ion milling such that it becomes long in the desired magnetization direction of the axis of easy magnetization. An $SiO_X$ film serving as an interlayer dielectric film is deposited on the entire surface by, e.g., RF sputtering. The $SiO_X$ film is planarized to expose the upper surface portion of the second MTJ element 200.

Next, the first MTJ element 100 is formed. More specifically, a second layered film including an anti-ferromagnetic layer (Ir—Mn)/fixed layer 111/tunnel barrier layer 112/recording layer 113 is deposited above the second MTJ element 200. The second layered film is processed by ion milling such that it becomes long in the desired magnetization direction of the axis of easy magnetization. The first and second MTJ elements 100 and 200 have the axes of easy magnetization in different directions.

After that, the substrate is heated to 350° C.+α while applying a magnetic field of several thousand Oe in the direction of the axis of easy magnetization of the second MTJ element 200, thereby fixing the magnetization direction of the fixed layer 211. Subsequently, the substrate is heated to 260° C.+α while applying a magnetic field of several thousand Oe in the direction of the axis of easy magnetization of the first MTJ element 100, thereby fixing the magnetization direction of the fixed layer 111 in a direction different from that of the second MTJ element 200.

When the directions of the axes of easy magnetization of the recording layers 113 and 213 of the first and second MTJ elements 100 and 200 are set by, e.g., shape anisotropy and magnetic annealing, the magnetic anisotropy can be made firmer. With this process, magnetic tunnel junctions with different directions of axes of easy magnetization can be stacked.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
a first write wiring which runs in a first direction;
a second write wiring which runs in a second direction different from the first direction and has a first crossing angle and second crossing angle formed by crossing the first write wiring, the first crossing angle and second crossing angle being located on both sides of the first write wiring serving as a boundary;
a first magnetoresistive element which is arranged at an intersection of the first write wiring and the second write wiring between the first write wiring and the second write wiring, has a first axis of easy magnetization directed to a side of the first crossing angle, and has a first fixed layer, a first recording layer, and a first tunnel barrier layer sandwiched between the first fixed layer and the first recording layer, the first recording layer including a first ferromagnetic layer located on a side of the first fixed layer, a second ferromagnetic layer, and a first nonmagnetic layer sandwiched between the first ferromagnetic layer and the second ferromagnetic layer; and
a second magnetoresistive element which is arranged at the intersection of the first write wiring and the second write wiring between the first write wiring and the second write wiring and electrically connected to the first magnetoresistive element, has a second axis of easy magnetization directed to a side of the second crossing angle, and has a second fixed layer, a second recording layer, and a second tunnel barrier layer sandwiched between the second fixed layer and the second recording layer, the second recording layer including a third ferromagnetic layer located on a side of the second fixed layer, a fourth ferromagnetic layer, and a second nonmagnetic layer sandwiched between the third ferromagnetic layer and the fourth ferromagnetic layer,
wherein in a write operation, magnetizations in the first recording layer and second recording layer execute a toggle operation by using the first write wiring and second write wiring.

2. The memory according to claim 1, wherein
the first crossing angle and second crossing angle are 90°, and
the first axis of easy magnetization and second axis of easy magnetization each tilt 45° with respect to one of the first direction and second direction.

3. The memory according to claim 1, wherein
the first magnetoresistive element has one of an elliptical shape and an oblong shape with round corners, whose aspect ratio in a direction of the first axis of easy magnetization is not less than 2, and
the second magnetoresistive element has one of an elliptical shape and an oblong shape with round corners, whose aspect ratio in a direction of the second axis of easy magnetization is not less than 2.

4. The memory according to claim 1, wherein
the first magnetoresistive element and second magnetoresistive element each have a circular shape.

5. The memory according to claim 1, further comprising a metal layer which is provided between the first magnetoresistive element and the second magnetoresistive element and has an area larger than each areas of the first magnetoresistive element and second magnetoresistive element.

6. The memory according to claim 1, wherein
the first magnetoresistive element and second magnetoresistive element are arranged above a semiconductor substrate,
the first fixed layer, first tunnel barrier layer, and first recording layer are formed in an order named from a side of the semiconductor substrate, and
the second fixed layer, second tunnel barrier layer, and second recording layer are formed in an order named from the side of the semiconductor substrate.

7. The memory according to claim 1, wherein
the first magnetoresistive element and second magnetoresistive element are arranged above a semiconductor substrate,
the first recording layer, first tunnel barrier layer, and first fixed layer are formed in an order named from a side of the semiconductor substrate, and the second fixed layer, second tunnel barrier layer, and second recording layer are formed in an order named from the side of the semiconductor substrate.

8. The memory according to claim 1, further comprising a contact which is provided between the first magnetoresistive element and the second magnetoresistive element.

9. The memory according to claim 1, wherein
one terminal of the first magnetoresistive element is connected to one terminal of the second magnetoresistive element, and
the memory further comprises a first electrode which is connected to the other terminal of the first magnetoresistive element and electrically isolated from the first write wiring and second write wiring, and
a second electrode which is connected to the other terminal of the second magnetoresistive element and electrically isolated from the first write wiring and second write wiring.

10. The memory according to claim 1, wherein
one terminal of the first magnetoresistive element is connected to one terminal of the second magnetoresistive element,
the other terminal of the first magnetoresistive element is connected to the first write wiring, and
the memory further comprises a first electrode which is connected to the other terminal of the second magnetoresistive element and electrically isolated from the first write wiring and second write wiring.

11. The memory according to claim 1, wherein
magnetizations of the first ferromagnetic layer and second ferromagnetic layer are antiferromagnetically or ferromagnetically coupled, and
magnetizations of the third ferromagnetic layer and fourth ferromagnetic layer are antiferromagnetically or ferromagnetically coupled.

12. A magnetic random access memory comprising:
a first write wiring which runs in a first direction;
a second write wiring which runs in a second direction different from the first direction and has a first crossing angle and second crossing angle formed by crossing the first write wiring, the first crossing angle and second crossing angle being located on both sides of the first write wiring serving as a boundary;
a first magnetoresistive element which is arranged at an intersection of the first write wiring and the second write wiring between the first write wiring and the second write wiring, has a first axis of easy magnetization directed to a side of the first crossing angle, and has a first fixed layer, a first recording layer, and a first tunnel barrier layer sandwiched between the first fixed layer and the first recording layer, the first recording layer including a first ferromagnetic layer located on a side of the first fixed layer, a second ferromagnetic layer, and a first nonmagnetic layer sandwiched between the first ferromagnetic layer and the second ferromagnetic layer; and
a second magnetoresistive element which is arranged at the intersection of the first write wiring and the second write wiring between the first write wiring and the second write wiring and electrically connected to the first magnetoresistive element, has a second axis of easy magnetization directed to a side of the second crossing angle, and has a second fixed layer, a second recording layer, and a second tunnel barrier layer sandwiched between the second fixed layer and the second recording layer.

13. A write method of a magnetic random access memory which includes
a first write wiring which runs in a first direction,
a second write wiring which runs in a second direction different from the first direction and has a first crossing angle and second crossing angle formed by crossing the first write wiring, the first crossing angle and second crossing angle being located on both sides of the first write wiring serving as a boundary,
a first magnetoresistive element which is arranged at an intersection of the first write wiring and the second write wiring between the first write wiring and the second write wiring, has a first axis of easy magnetization directed to a side of the first crossing angle, and has a first fixed layer, a first recording layer, and a first tunnel barrier layer sandwiched between the first fixed layer and the first recording layer, the first recording layer including a first ferromagnetic layer located on a side of the first fixed layer, a second ferromagnetic layer, and a first nonmagnetic layer sandwiched between the first ferromagnetic layer and the second ferromagnetic layer, and
a second magnetoresistive element which is arranged at the intersection of the first write wiring and the second write wiring between the first write wiring and the second write wiring and electrically connected to the first magnetoresistive element, has a second axis of easy magnetization directed to a side of the second crossing angle, and has a second fixed layer, a second recording layer, and a second tunnel barrier layer sandwiched between the second fixed layer and the second recording layer, the second recording layer including a third ferromagnetic layer located on a side of the second fixed layer, a fourth ferromagnetic layer, and a second nonmagnetic layer sandwiched between the third ferromagnetic layer and the fourth ferromagnetic layer,
the write method writing binary information in the first magnetoresistive element and second magnetoresistive element by supplying a first write current to the first write wiring and a second write current to the second write wiring, comprising:
starting supplying one current of one of the first write current and second write current earlier than the other current of the other of the first write current and second write current;
supplying the other current in addition to the one current;
reducing a current value of the one current to not more than a write threshold value earlier than the other current; and
reducing a current value of the other current to not more than the write threshold value,
wherein an order of starting or ending supply of the first write current and second write current and directions in which the first write current and second write current are supplied are changed to selectively cause one of the first magnetoresistive element and second magnetoresistive element to execute a toggle operation.

14. The method according to claim 13, wherein
when a resistance value when first data is written in the first magnetoresistive element is defined as a first resistance value, a resistance value when the first data is written in the second magnetoresistive element is defined as a second resistance value, a resistance value when second data is written in the first magnetoresistive element is defined as a third resistance value, and a resistance value when the second data is written in the second magnetoresistive element is defined as a fourth resistance value, a value obtained by adding the first resistance value and second resistance value, a value obtained by adding the third resistance value and second resistance value, a value obtained by adding the first resistance value and fourth resistance value, and a value obtained by adding the third resistance value and fourth resistance value are different.

15. A write method of a magnetic random access memory which includes a first write wiring which runs in a first direction, a second write wiring which runs in a second direction different from the first direction and has a first crossing angle and second crossing angle formed by crossing the first write wiring, the first crossing angle and second crossing angle being located on both sides of the first write wiring serving as a boundary, a first magnetoresistive element which is arranged at an intersection of the first write wiring and the second write wiring between the first write wiring and the second write wiring, has a first axis of easy magnetization directed to a side of the first crossing angle, and has a first fixed layer, a first recording layer, and a first tunnel barrier layer sandwiched between the first fixed layer and the first recording layer, the first recording layer including a first ferromagnetic layer located on a side of the first fixed layer, a second ferromagnetic layer, and a first nonmagnetic layer sandwiched between the first ferromagnetic layer and the second ferromagnetic layer, and a second magnetoresistive element which is arranged at the intersection of the first write wiring and the second write wiring between the first write wiring and the second write wiring and electrically connected to the first magnetoresistive element, has a second axis of easy magnetization directed to a side of the second crossing angle, and has a second fixed layer, a second recording layer, and a second tunnel barrier layer sandwiched between the second fixed layer and the second recording layer, the write method writing binary information in the first magnetoresistive element and second magnetoresistive element by supplying a first write current to the first write wiring and a second write current to the second write wiring, comprising:

starting supplying one current of one of the first write current and second write current earlier than the other current of the other of the first write current and second write current;

supplying the other current in addition to the one current;

reducing a current value of the one current to not more than a write threshold value earlier than the other current; and reducing a current value of the other current to not more than the write threshold value, wherein an order of starting or ending supply of the first write current and second write current and directions in which the first write current and second write current are supplied are changed to selectively independently execute a first operation and second operation, the first operation is causing or not causing the first magnetoresistive element to execute a toggle operation, and the second operation is reversing magnetization in the second recording layer of the second magnetoresistive element.

* * * * *